(12) United States Patent
Barnawi

(10) Patent No.: US 11,115,077 B1
(45) Date of Patent: Sep. 7, 2021

(54) WIRELESS COMMUNICATION METHOD FOR MODULATING DATA SIGNALS IN A CHIRP SPREAD SPECTRUM COMMUNICATION SYSTEM

(71) Applicant: King Abdulaziz University, Jeddah (SA)

(72) Inventor: Ahmed Barnawi, Jeddah (SA)

(73) Assignee: King Abdulaziz University, Jeddah (SA)

(*) Notice: Subject to any disclaimer, the term of this patent is extended or adjusted under 35 U.S.C. 154(b) by 0 days.

(21) Appl. No.: 17/034,830

(22) Filed: Sep. 28, 2020

Related U.S. Application Data

(63) Continuation of application No. 16/983,575, filed on Aug. 3, 2020, now Pat. No. 10,840,969.

(51) Int. Cl.
| | | |
|---|---|---|
| *H04B 1/00* | (2006.01) | |
| *H04B 1/69* | (2011.01) | |
| *H04B 1/04* | (2006.01) | |
| *H04B 1/16* | (2006.01) | |
| *H04L 27/20* | (2006.01) | |

(Continued)

(52) U.S. Cl.
CPC ............. *H04B 1/69* (2013.01); *H01Q 23/00* (2013.01); *H03F 3/19* (2013.01); *H03H 17/02* (2013.01); *H03K 19/20* (2013.01); *H04B 1/04* (2013.01); *H04B 1/16* (2013.01); *H04L 27/20* (2013.01); *H04B 2001/6912* (2013.01)

(58) Field of Classification Search
CPC ... H04B 1/69; H04B 1/04; H04B 1/16; H01Q 23/00; H03F 3/19; H03H 17/02; H03K 19/20; H04L 27/20
USPC ............... 375/139, 131, 130, 219, 295, 316
See application file for complete search history.

(56) References Cited

U.S. PATENT DOCUMENTS

| | | |
|---|---|---|
| 5,448,170 A | 9/1995 | Bodenhausen et al. |
| 6,252,882 B1 * | 6/2001 | Matsui ............. H04B 1/69 370/441 |

(Continued)

FOREIGN PATENT DOCUMENTS

| | | |
|---|---|---|
| JP | 2001-166041 A | 6/2001 |
| WO | 2015/148477 A1 | 10/2015 |

OTHER PUBLICATIONS

Wolf, et al.; Non-Coherent UWB Communications; Frequenz 63 (2009); pp. 187-191; 5 Pages.

(Continued)

*Primary Examiner* — Zewdu A Kassa
(74) *Attorney, Agent, or Firm* — Oblon, McClelland, Maier & Neustadt, L.L.P.

(57) ABSTRACT

A system and methods for transmission and non-coherent detection of data signals modulated by a plurality of overlapping chirps in a chirp spread spectrum communication system (CSS). Data signals input to an adaptive overlapping transmitter are modulated by a plurality of overlapping chirps and transmitted over a wireless communication system to a non-coherent receiver. The coherent receiver includes a chirp matched filter which matches the chirps to an internal chirp signal, a delay filter which delays each chirp, a multiplier which multiplies each delayed chirp by a next chirp, an integrator which sums the amplitudes of the chirps and decision circuitry which determines the polarity of each sum and outputs a stream of ones and zeroes representing the data signals.

5 Claims, 16 Drawing Sheets

(51) Int. Cl.
    *H03F 3/19*     (2006.01)
    *H03H 17/02*     (2006.01)
    *H03K 19/20*     (2006.01)
    *H01Q 23/00*     (2006.01)

(56) References Cited

U.S. PATENT DOCUMENTS

| | | |
|---|---|---|
| 6,940,893 B1 | 9/2005 | Pinkney et al. |
| 2004/0037370 A1 | 2/2004 | Mori et al. |

OTHER PUBLICATIONS

Zhang, et al. ; An Ultra-Wide Band System with Chirp Spread Spectrum Transmission Technique ; 2006 6th International Conference on ITS Telecommunications Proceedings ; pp. 294-297 ; 4 Pages.

* cited by examiner

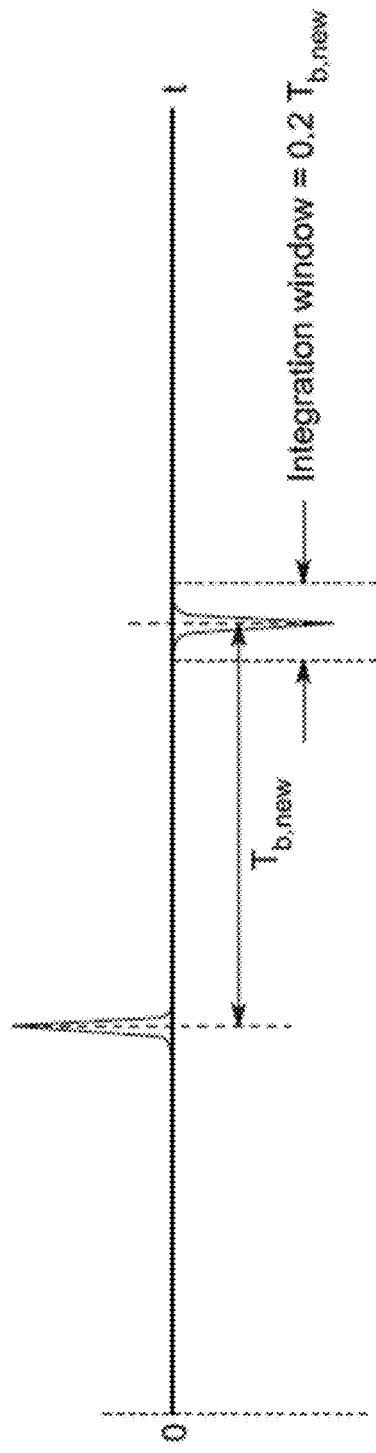
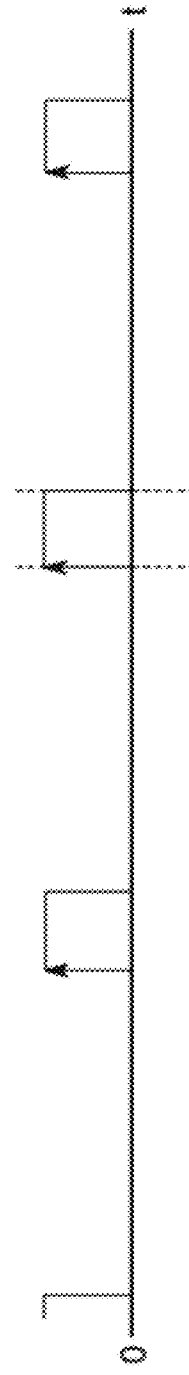
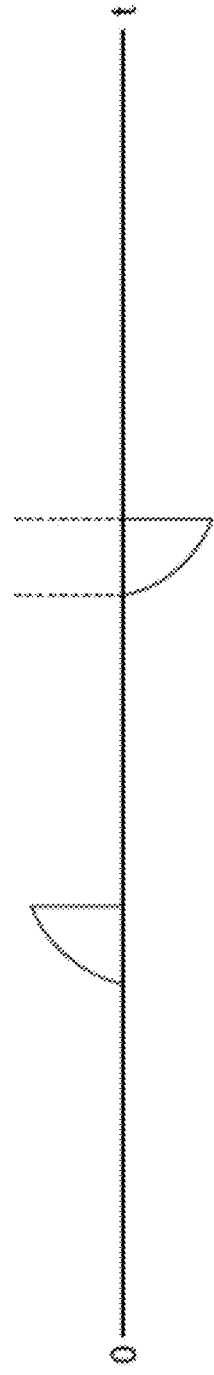
FIG. 9A
FIG. 9B
FIG. 9C

WIRELESS COMMUNICATION METHOD FOR MODULATING DATA SIGNALS IN A CHIRP SPREAD SPECTRUM COMMUNICATION SYSTEM

CROSS-REFERENCE TO RELATED APPLICATIONS

The present application is a Continuation of Ser. No. 16/983,575, pending, having a filing date of Aug. 3, 2020. U.S. Patent Application titled "Coherent Detection Of Overlapping Chirp Symbols To Increase The Data Rate Of Chirp Spread Spectrum (CSS) Communication System", U.S. application Ser. No. 16/940,872 which names inventors in common with the inventors of the present disclosure, is incorporated herein by reference in its entirety.

BACKGROUND

Technical Field

The present disclosure is directed to a system and methods for encoding data signals with overlapping chirp signals and for non-coherent detection of an overlapped chirp signal in a chirp spread spectrum communication system (CSS).

Description of Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

Chirp communications are typically used in low cost, battery powered systems operating using low data rates and short messages, often in noisy environments or over long distances. As a result of these conditions, interference, such as multipath interference, reduces the accuracy of decoding the communications. Thus, a method for transmitting more data within a given bandwidth and a means to remove interference is desired.

Modulating the data signals with overlapping chirps has the benefit of increasing the data rate of the transmission of the data. A non-coherent receiver must be capable of decoding the encoded signals and removing noise and multipath distortions.

Accordingly, it is one object of the present disclosure to provide a system and methods for transmitting data signals encoded with overlapped chirp signals and for non-coherently receiving and decoding the data signals.

SUMMARY

In an exemplary embodiment, a system for transmission and non-coherent detection of data signals modulated by a plurality of overlapping chirps in a chirp spread spectrum communication system (CSS) is described, comprising an adaptive overlapping transmitter configured to receive a bit stream of data signals at a first data rate ($R_{old}$) and a sweep frequency (F), the adaptive overlapping transmitter including a data rate generator configured to increase the first data rate ($R_{old}$) of the bit stream of data signals to a second data rate ($R_{new}$), wherein the second data rate is greater than the first data rate, a differential phase converter configured to encode the data signals at the second data rate with a phase difference between each two consecutive bits and generate a phase encoded bit stream, an antipodal pulse converter connected in series to the data rate generator and configured to convert the phase encoded bit stream to positive and negative pulses, a finite impulse response (FIR) chirp generator connected in series to the antipodal pulse converter and configured to generate chirp signals from the positive and negative pulses, a gain amplifier connected in series to the FIR chirp generator and configured to increase the gain of the chirp signals and output a chirp modulated stream of data signals, a wireless antenna connected in series with the gain amplifier and configured to transmit the chirp modulated stream of data signals, a first computing device operatively connected to the adaptive overlapping transmitter, the first computing device including a first computer-readable medium comprising first program instructions, executable by first processing circuitry, to cause the first processing circuitry to modulate the bit stream of data signals by a plurality of overlapping chirps and actuate the wireless antenna to transmit the chirp modulated stream of data signals, a non-coherent receiver configured to receive the chirp modulated stream of data signals, the non-coherent receiver comprising a non-coherent finite impulse response (FIR) chirp matched filter configured to match the chirp modulated stream of data signals and generate a first chirp matched signal, a FIR delay filter operatively connected to the non-coherent finite impulse response (FIR) chirp matched filter and configured to generate a second chirp matched signal which is phase shifted from the first chirp matched signal, a multiplier operatively connected to the FIR delay filter and configured to multiply the second chirp matched signal by the first chirp matched signal to generate a multiplied chirp matched signal, an integrator operatively connected to the multiplier and configured to sum the amplitudes of multiplied chirp matched signal over a time period, a decision circuit operatively connected to the integrator, the decision circuit including with a second computing device having a second computer-readable medium comprising second program instructions, executable by second processing circuitry, to cause the second processing circuitry to determine a polarity of each bit based on the sum of the amplitudes, convert each bit to a one or a zero based on its polarity and output a decoded stream of ones and zeroes representative of the data signals.

In another exemplary embodiment, a method is described which includes modulating data signals with a plurality of overlapping chirps by an adaptive overlapping transmitter in a chirp spread spectrum communication system (CSS), comprising receiving a stream of data signals at a first data rate ($R_{old}$), increasing the first data rate of the data signals to a second data rate ($R_{new}$), encoding the data signals at the second data rate with a phase difference between each two consecutive bits and generating a phase encoded bit stream, converting the data signals to positive and negative pulses, generating a plurality of overlapping chirp signals from the positive and negative pulses, increasing the gain of the chirp signals by a factor equal to the ratio of the second data rate divided by the first data rate and outputting an encoded stream of data signals modulated by a plurality of overlapping chirps, transmitting the encoded stream in the chirp spread spectrum communications system.

In another exemplary embodiment, a method for non-coherent detection of data signals modulated by a plurality of overlapping chirps in a chirp spread spectrum communication system (CSS) is described, comprising receiving an encoded stream of data signals modulated by a plurality of overlapping chirps by a non-coherent receiver at non-coherent FIR chirp matched filter, the encoded stream having a data rate, $T_{b,new}$, generating an internal chirp signal by a non-coherent finite impulse response (FIR) chirp matched filter, the internal chirp signal having an FT product equal to a sweep frequency (F) multiplied by the inverse of the data rate of the chirp spread spectrum communication system, $T_{b,old}$, matching the encoded stream to the internal chirp signal and generating a stream of first chirp matched signals, delaying each first chirp matched signal by a FIR delay filter and generating a second chirp matched signal which is phase shifted from the first chirp matched signal, multiplying the second chirp matched signal by the first chirp matched signal and generating a stream of multiplied chirp matched signals each having a main lobe, integrating a plurality of amplitudes of the stream of multiplied chirp matched signals over each main lobe for a time period less than the inverse of the first data rate and generating a sum of the amplitudes for each of the multiplied chirp matched signals, determining a polarity of the sum of the amplitudes for each of the multiplied chirp matched signals, converting each sum to a one or a zero based on the polarity, and outputting a decoded stream of ones and zeroes representative of a plurality of data signals.

The foregoing general description of the illustrative embodiments and the following detailed description thereof are merely exemplary aspects of the teachings of this disclosure, and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein:

FIGS. 9A-9C show A) the output after multiplication, B) the integration window being positioned over the main lobe and adjusted to the length of 0.2 $T_{b,new}$ and C) the output after integration which is fed to the decision circuit.

DETAILED DESCRIPTION

Figure 1A:
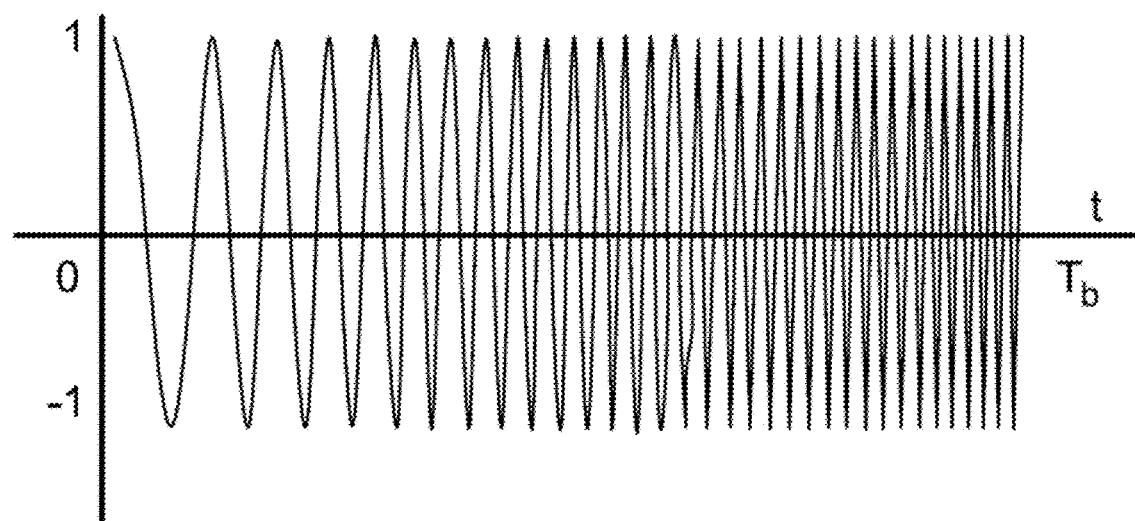
FIGS. 1A-1B illustrate A) a digital chirp signal over $T_b$=20 ms, and B) the instantaneous frequency sweeps from $f_1$=0 rad/sec to $f_2$=1350 rad/sec over $T_b$=20 ms.

In the drawings, like reference numerals designate identical or corresponding parts throughout the several views. Further, as used herein, the words "a," "an" and the like generally carry a meaning of "one or more," unless stated otherwise. The drawings are generally drawn to scale unless specified otherwise or illustrating schematic structures or flowcharts.

Furthermore, the terms "approximately," "approximate," "about," and similar terms generally refer to ranges that include the identified value within a margin of 20%, 10%, or preferably 5%, and any values therebetween.

Aspects of this disclosure are directed to a system for transmission and non-coherent detection of data signals modulated by a plurality of overlapping chirps in a chirp spread spectrum communication system (CSS), a method for modulating data signals with a plurality of overlapping chirps by an adaptive overlapping transmitter in a CSS communication system and a method for non-coherent detection of data signals modulated by a plurality of overlapping chirps in a CSS communication system.

The chirp spread spectrum (CSS) is a spread spectrum technique that uses wideband linear frequency modulated chirp pulses to encode information. A chirp is a sinusoidal signal of frequency which increases or decreases over time (often with a polynomial expression for the relationship between time and frequency). As with other spread spectrum methods, the chirp spread spectrum uses its entire allocated bandwidth to broadcast a signal, making it robust to channel noise. Further, because the chirps utilize a broad band of the spectrum, the chirp spread spectrum is also resistant to multi-path fading even when operating at very low power. However, it is unlike direct-sequence spread spectrum (DSSS) or frequency-hopping spread spectrum (FHSS) in that it does not add any pseudo-random elements to the signal to help distinguish it from noise on the channel, instead relying on the linear nature of the chirp pulse.

The chirp signal is an analog signal with instantaneous frequency that linearly sweeps from minimum to maximum frequency values over the duration of the bit, $T_b$. The instantaneous frequency is a useful concept for describing non-monochromatic (polychromatic) signals. It is defined as:

$$v(t) = \frac{1}{2\pi} d\varphi/dt,$$

i.e., essentially as the temporal derivative of the oscillation phase φ. The instantaneous frequency is generally a time-dependent frequency. The concept of the instantaneous frequency is particularly important in the context of frequency noise and phase noise.

The present disclosure relates to the detection of data signals encoded by overlapping chirp signals. When an overlapping chirp signal is used to increase data rate of a CSS system, the chirp signals are used to modulate the binary symbols i.e. Mark (or logic One) and Space (or logic Zero).

In bandpass modulation (e.g. ASK, FSK and PSK), the mark and space (logic 1 and logic 0) are modulated using sinusoidal carrier with a fixed frequency over the duration of digital bit ($T_b$). However, in a CSS system, the Mark and Space are modulated using a chirp signal as a carrier.

Figure 1B:
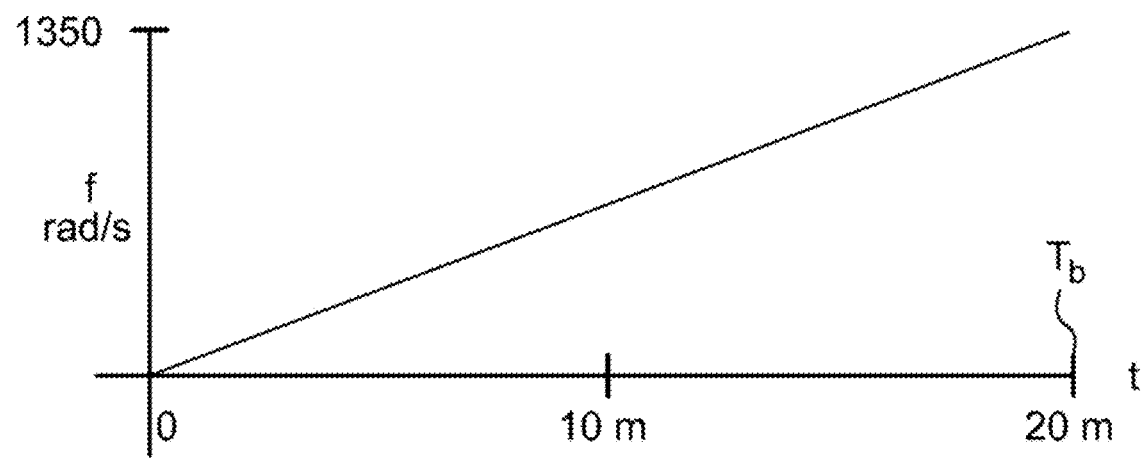

A chirp signal is an analog signal with instantaneous frequency that linearly sweeps from a minimum to a maximum frequency values over the duration of the bit, $T_b$. FIG. 1A shows a chirp signal over the range of $T_b$=20 ms and FIG. 1B shows its linear instantaneous frequency which sweeps from $f_1$=0 rad/sec to $f_2$=1350 rad/sec over $T_b$=20 ms.

Inter Symbol Interference (ISI) is a phenomenon that occurs while receiving digital symbols. ISI causes spreading of the energy of the modulated digital symbol, thus consecutive digital symbols interfere with one another. This problem worsens the reception of the digital symbol, especially in case of multipath propagation in the presence of noise disturbances.

CSS performance with respect to ISI is known to be much better than performance of bandpass systems due to the fact that a CSS signal is a wideband signal, i.e., it has bandwidth greater than the keying rate. The keying rate is the rate at which the digital bits are generated. The bandwidth expansion gives CSS signals some immunity against ISI.

CSS performance in terms of signal fading is also superior to that of bandpass systems. Fading is a major impairment for a signal travelling in the space. It is attributed to the signal multipath propagation.

The processing gain (PG) coefficient represents the ratio of the CSS signal bandwidth to the keying rate. The processing gain is calculated as the product of the frequency sweep (F) multiplied by the bit duration ($T_b$), i.e. processing gain: (FT product)=$F*T_b$.

The higher the FT product, the better the performance in terms of multipath fading and ISI. To increase the FT product, either the sweeping frequency range (F) is increased or the bit duration $T_b$ is increased.

Increasing the bit duration $T_b$ results in reducing the keying rate, which reduces the data rate of the generated digital symbols. Increasing the frequency sweep increases the system bandwidth which increases the cost of the system due to the bandwidth requirements.

Selection of the values of F and $T_b$ in CSS should be made to satisfy the optimal performance of the spreading (best distribution of the signal power (energy) over the bandwidth). Based on experimentation and theory, the best outcome of the spreading in CSS occurs when the FT product is greater or equal to 54.

Figure 2A:
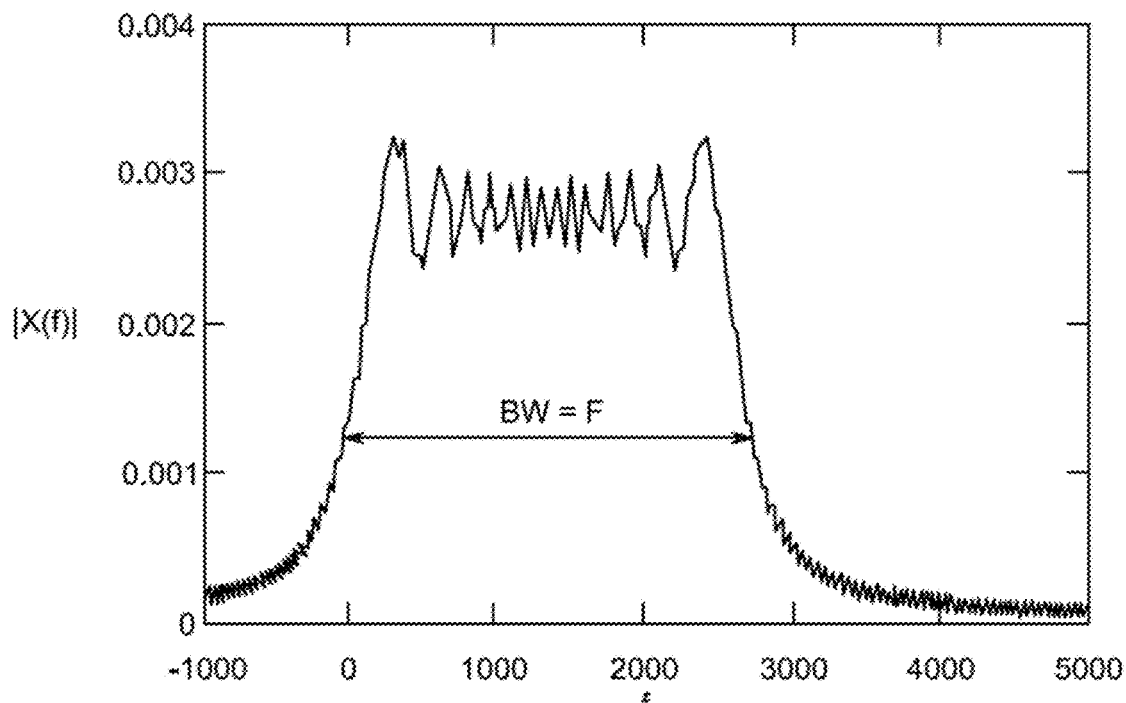
FIGS. 2A-2B illustrate A) chirp signal with FT=54 where the signal bandwidth is equal to the sweeping frequency range $f_2-f_1$=2700 Hz, and B) with FT=15 where the bandwidth is less than the sweeping frequency F which equals 1500 Hz.
Figure 2B:
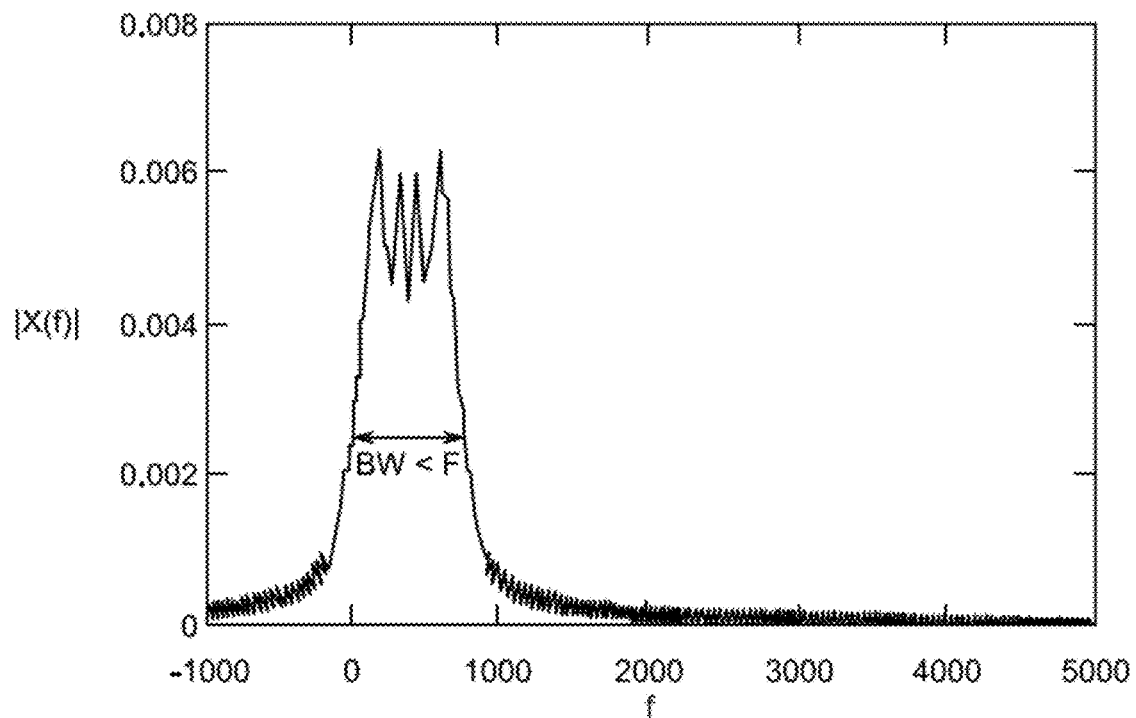

FIGS. 2A, 2B show one chirp signal with FT product equal to 54, in which the bandwidth of the signal is equal to the frequency sweep, (i.e., signal bandwidth equal to the sweeping frequency range $f_2-f_1$=2700 Hz, for T=20 ms, FIG. 2A), and another chirp signal with FT product equal to 15, in which the bandwidth of the signal is less than value of frequency sweep, (i.e., the sweeping frequency equals 1500 Hz, for T=20 ms, FIG. 2B). Moreover, the shape of the chirp signal spectrum with higher FT product (FIG. 2A) is more evenly distributed or symmetrical. For an FT product greater than 100, the shape of the spectrum can be approximated as almost perfect rectangular shape.

In the present disclosure, given a CSS communication system with a specific FT product, a system and methods are described for increasing the data rate while maintaining the FT product.

Figure 3A:
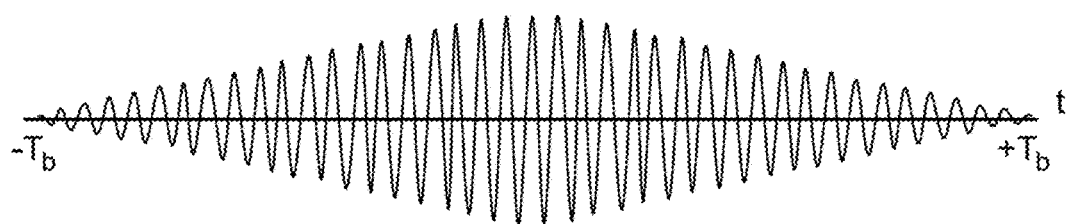
FIGS. 3A-3B illustrate A) the output of the matched filter of a sinusoidal carrier in FSK, and B) the output of chirped signal carrier.
Figure 3B:
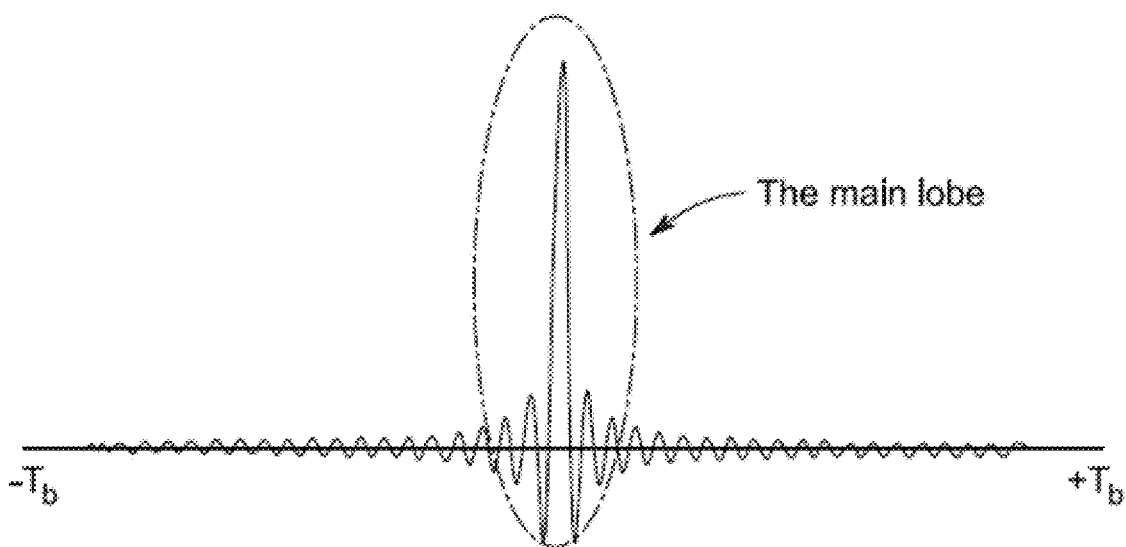

An advantage of the present disclosure is that chirp signal reception can be performed with a chirp signal matched filter. Signal matched filtering is a conventional process which used to optimally detect a modulated symbol using a time correlation method. FIG. 3A shows the output of the matched filter of a sinusoidal carrier in FSK. The advantage of chirp signal matched filtering over sinusoidal match filtering is that the output of the chirp signal matched filter produces a "compressed" output where most of the signal energy exists over a main lobe 302 as shown in FIG. 3B, unlike the case with sinusoidal wave matched filter shown in FIG. 3A, where there is no distinction of energy spreading.

Taking advantage of the chirp signal matched filter output, the selection of F and Tb for the F*T product can be made as follows: the data rate of the CSS system can be increased while maintaining the FT product at the same performance as with no overlapping, by the technique of adaptive time overlapping of the consecutive chirp symbols at the transmitter and non-coherent detection at the receiver. This method will not affect the performance of detecting the chirp signal in the presence of noise disturbances and other signal impairments (fading and ISI). This may be attributed to the fact that most of the signal's matched filter output exists in a distinctive main lobe 302 in the case of chirp signal output as shown in FIG. 3B as compared to that of an FSK sinusoidal signal output when this distinction doesn't exist as shown in FIG. 3A. The energy in the side lobes of the chirp signal shown in FIG. 3B are insignificant compared to the energy in main lobe, thus overlapping can be achieved as long as the main lobes in the consecutive symbols do not interfere with one another.

Aspects of the present disclosure include (1) a method for adaptive time overlapping of consecutive chirp signals, (2) a method for non-coherent detection of overlapped chirp signals.

Figure 4:
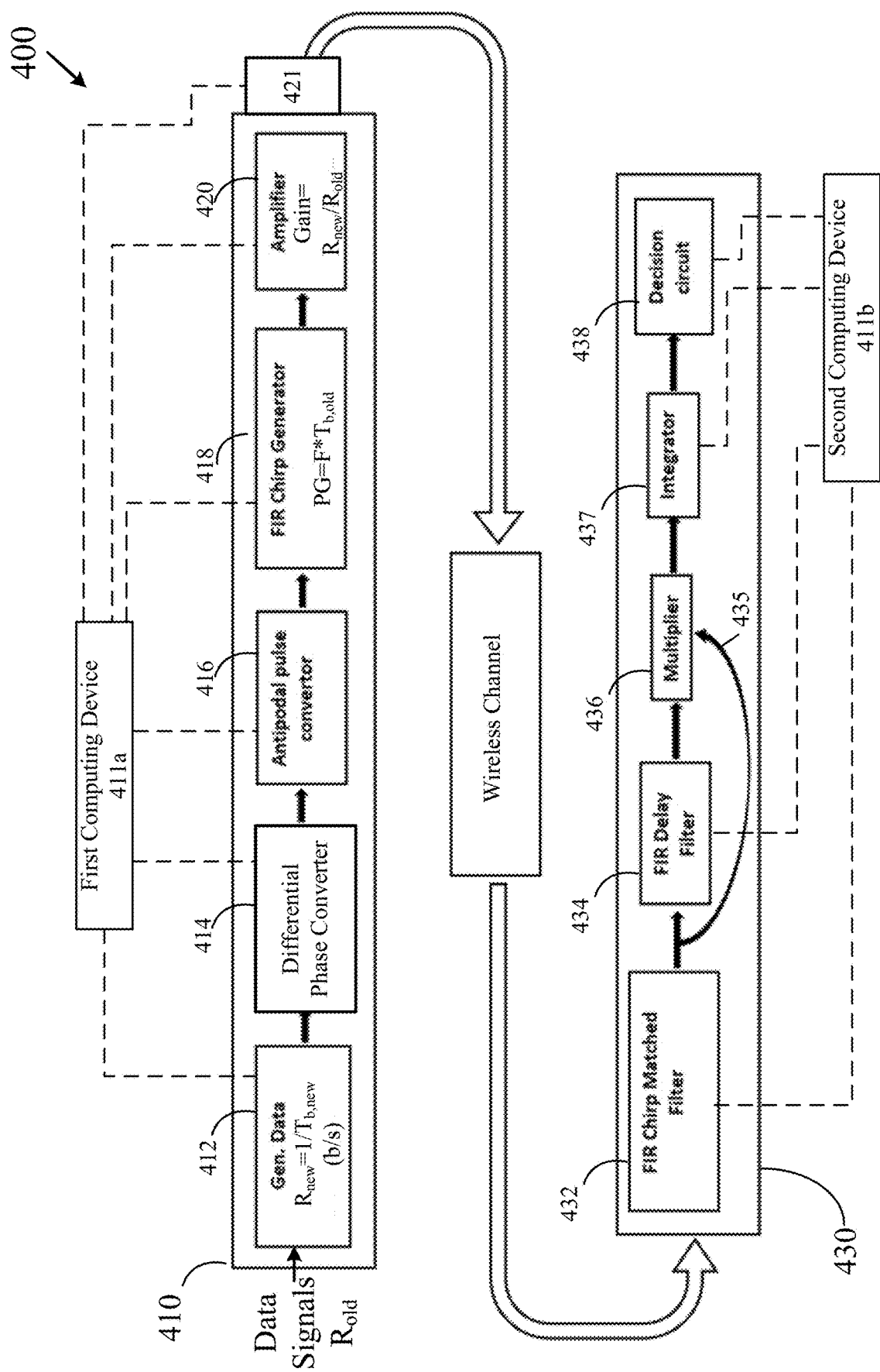
FIG. 4 illustrates a system block diagram having an adaptive overlapping transmitter and a non-coherent receiver.

FIG. 4 is a block diagram of the system 400 for transmission and non-coherent detection of overlapped chirp signals.

The adaptive overlapping transmitter 410 includes a first computing device 411 including a computer-readable medium comprising program instructions, executable by processing circuitry, to cause the processing circuitry to operate the components of the adaptive overlapping transmitter to perform the encoding of the data signals with overlapping chirp signals.

At the adaptive overlapping transmitter 410, data signals are received at rate $R_{old}$. The data is converted by data rate generator (412) to a new data rate $R_{new}$ ($R_{new}=1/T_{b,new}$), which is higher than the CSS system original data rate $R_{old}$ ($R_{old}=1/T_{b,old}$).

Figure 5A:
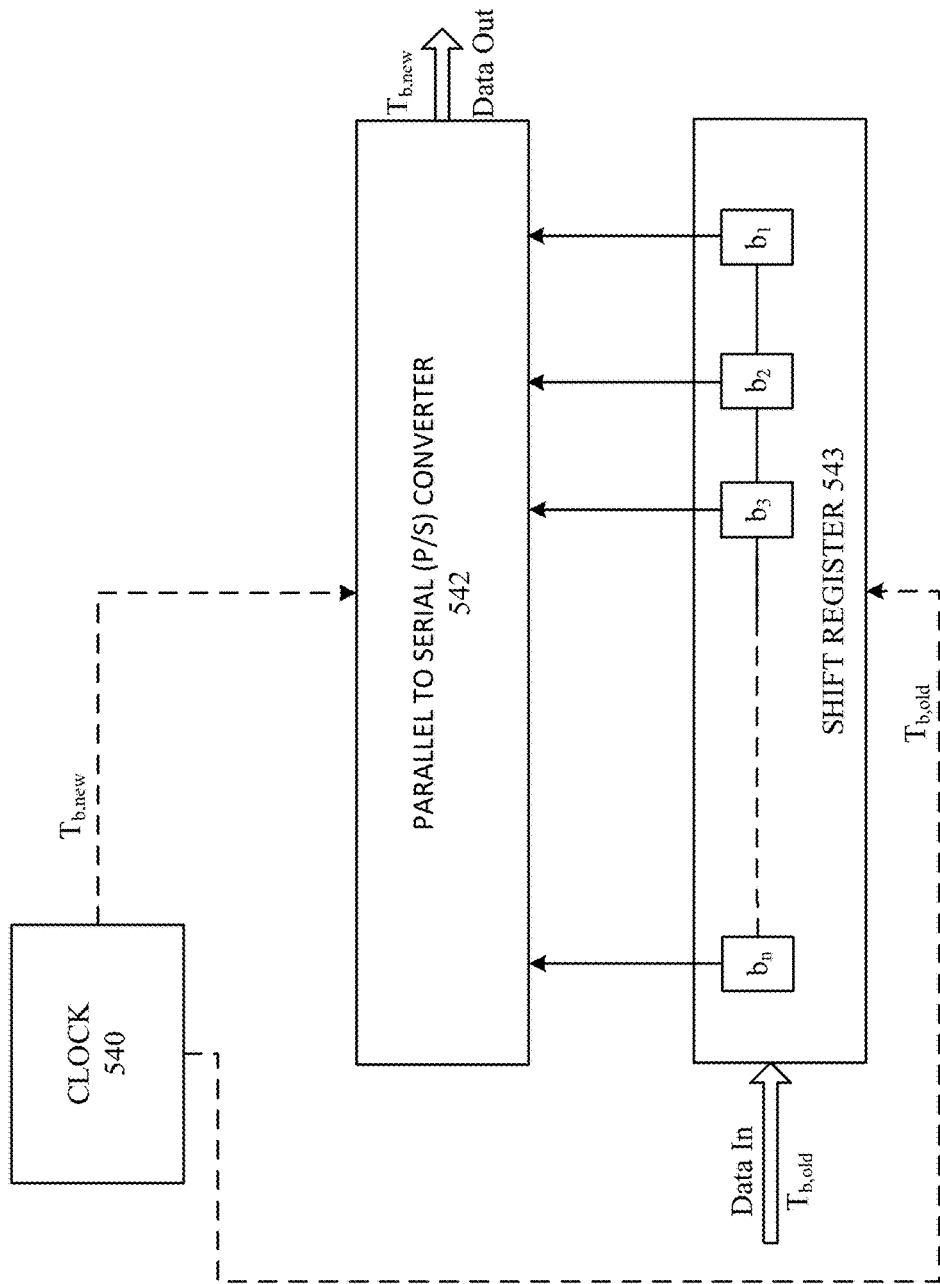
FIG. 5A illustrates a data rate generator.

FIG. 5A shows a block diagram of the data rate generator 412. The input to the data generator is the data stream with its original data rate, $R_{old}$, and the output is the data stream with its new data rate, $R_{new}$. This process is accomplished in the following steps:

1. Data In at $T_{b,old}$ enters a shift register 543 implemented using memory elements (D-flipflops). The number of memory elements (n) in the shift register is usually a multiple of 2 (e.g. 4, 8, 16 . . . ).

2. The shift register fills up with the input data stream, where at each clock signal, the input bit is shifted to the next flipflop thus the first bit in the stream that enters the shift register is written in the flipflop position ($b_1$) and the last bit to enter the shift register is written into the ($b_n$) flipflop position.
3. Once the $n^{th}$ bit enters $b_n$ position, the parallel to serial convertor 542 reads the bits stored in the memory elements in parallel and generates the stream again serially at the new $R_{new}$ rate in the same order it entered.
4. A clock circuit 540 provides the clock signal to drive both the shift register 543 and the P/S convertor 542, thus the clock rate for the P/S convertor ($1/T_{b,new}$) is a multiple of the clock rate provided to the shift register ($1/T_{b,old}$).

Figure 5B:
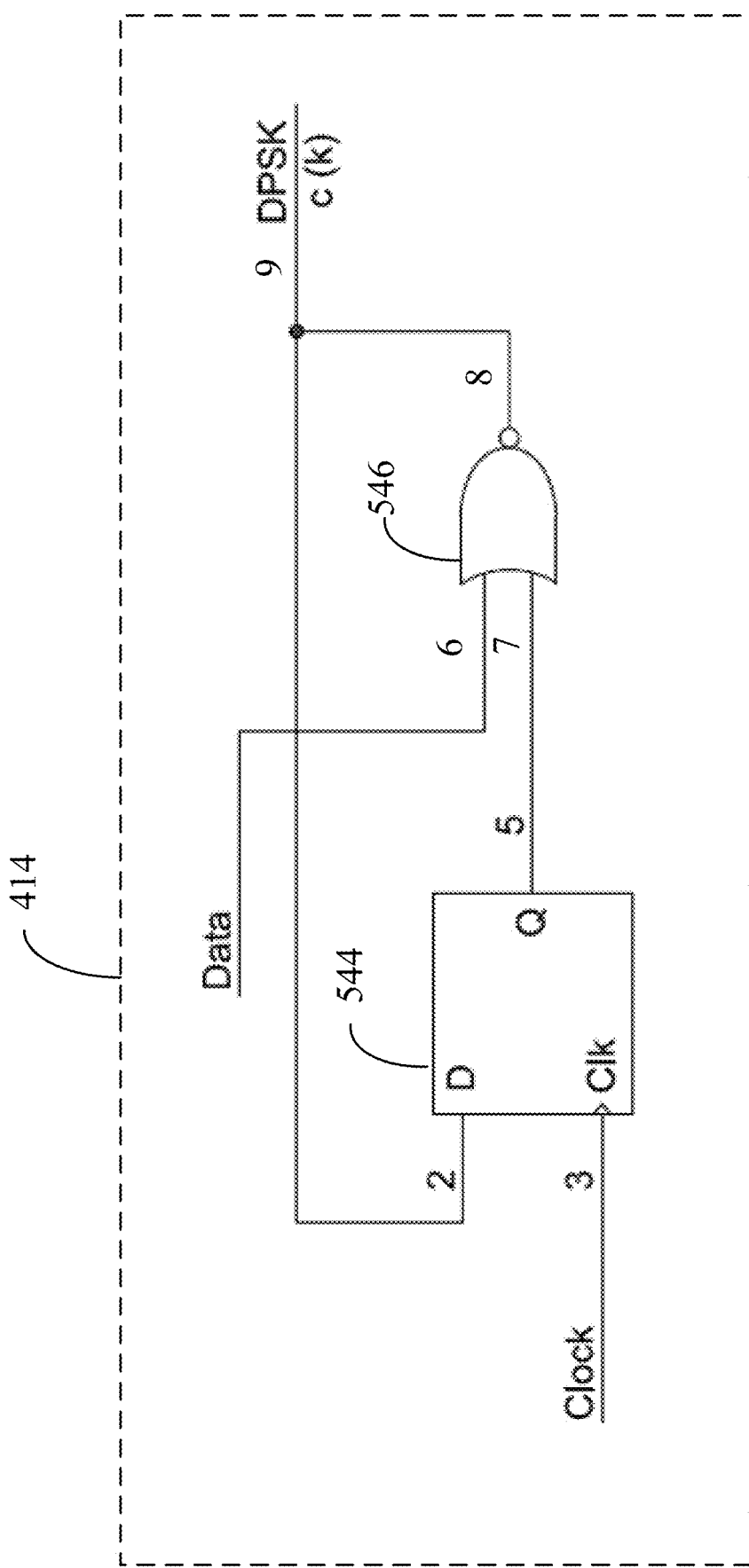
FIG. 5B illustrates a DPSK Convertor.

In order to facilitate non-coherent detection, the data generated at the rate $R_{new}$ is used as an input for a differential phase shift keying (DPSK) convertor 414. The DPSK convertor is an electronic circuit that is used to encode the generated bits within the phase difference between each two consecutive bits, FIG. 5B shows the differential phase convertor components. Differential phase encoding is a technique used to encode the bit stream within the phase difference between the current bit and its predecessor so at the receiver, based on the phase difference between the bits, the original bits may be recovered. Using differential phase encoding in transmission is advantageous in terms of non-coherent detection, as it simplifies the receiver components, as non-coherent detection does not then require the regeneration of a reference carrier which must be synchronized with the clock at the transmitter. The DPSK converter includes a flip-flop 544 and a NOR gate 546. The flip-flop has a clock input (3) and an input (2) for a feedback signal from the output of the NOR gate. Data signals are applied to a first input (6) of the NOR gate. The output (5) of the flip flop is input to a second input (7) of the NOR gate. The output (1) of the NOR gate is fed back to the D input of the flip flop. The output (1) is the DPSK signal. The first computing device 411 is configured to provide the clock input signal to the flip-flop 544 and to bias the transistors (not shown) in the flip-flop and the NOR gate.

The output (1) of the differential phase convertor is further converted to antipodal pulses at antipodal pulse converter 416, thus the logic one and logic zero are converted into positive and negative pulses and are used to impulse the FIR chirp generator 418 to generate CSS signals.

Figure 6A:
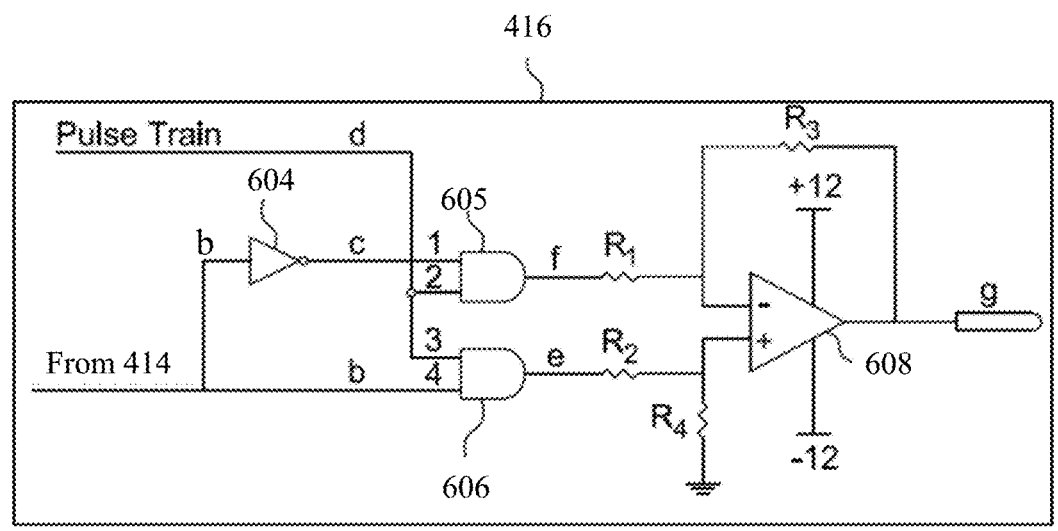
FIG. 6A-6B illustrate A) an antipodal pulse convertor, B) a timing example at various points of the antipodal pulse converter.
Figure 6B:
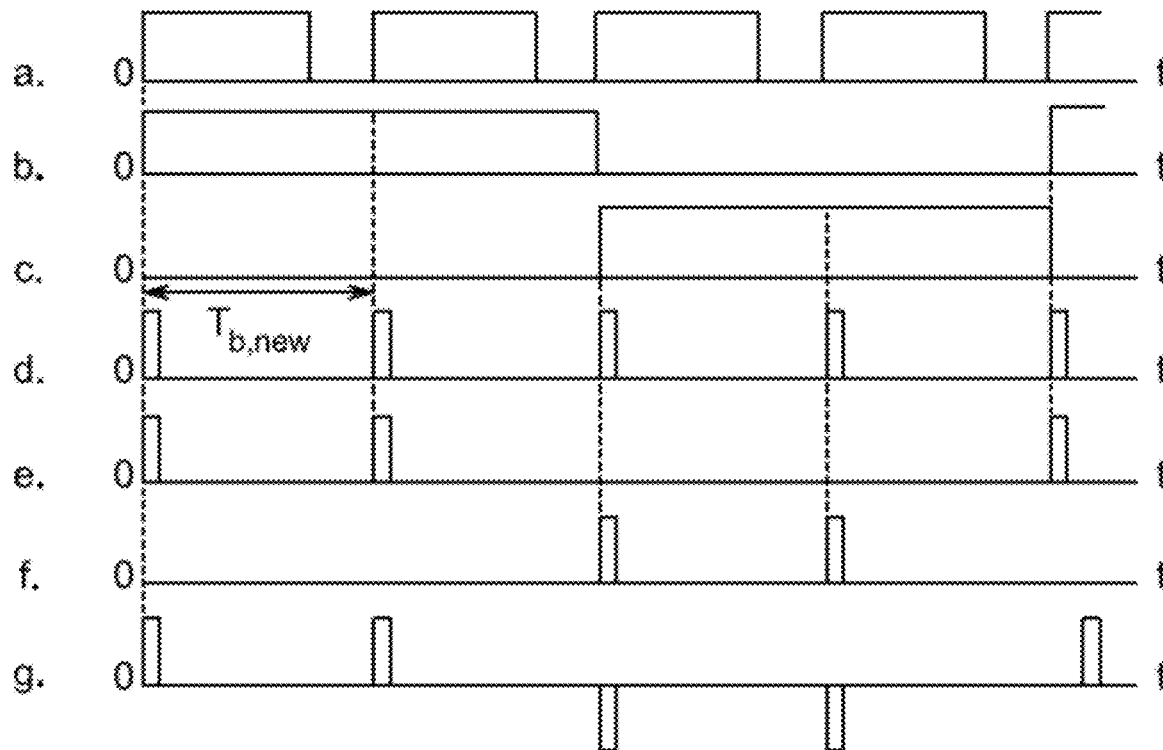

FIG. 6A, 6B show an example of antipodal pulse conversion, in which it can be noted that the pulse rate of the generated pulses (g) are equivalent to the desired higher data rate $R_{new}=1/T_{b,new}$. FIG. 6A shows a circuit diagram of the antipodal pulse converter.

In FIG. 6A, a pulse train (d) at data rate $R_{new}=1/T_{b, new}$ is input to AND gate 605 at input 2 and to AND gate 606 at input 4. A DPSK clock signal is input at (a) to inverter 604 and the inverter output (c) is input to AND gate 605 at input 1. The DPSK clock signal is also input at (b) to inverter 606 at input 4. The output of AND gate 605 (f) passes through resistor $R_1$ and is input to the inverting input of operational amplifier 608. The output of AND gate 606 (e) passes into a voltage divider formed by resistor $R_2$ and $R_4$ and is input to the non-inverting input of operational amplifier 608. The output of operational amplifier 608 is fed back through resistor $R_3$ to the inverting input and is also received at (g) which is the output of the antipodal pulse converter 614. The AND gates (605, 606) and operational amplifier (608) are biased by the first computing device 411a.

FIG. 6B shows the pulse trains at circuit points (a)-(g) of the antipodal pulse converter of FIG. 6A.
In FIG. 6B, the pulse trains represent:
(a) The clock signal;
(b) The DPSK data signal;
(c) The inverse of the DPSK data;
(d) The input train of pulses at data rate $T_{b, new}$;
(e) (b)+(d);
(f) (c)+(d);
(g) (e)−(f).

The antipodal pulses are used to impulse a finite impulse response (FIR) filter of the FIR chirp generator 418 that is programmed to generate the chirp signal by modifying the FIR coefficients.

Figure 7A:
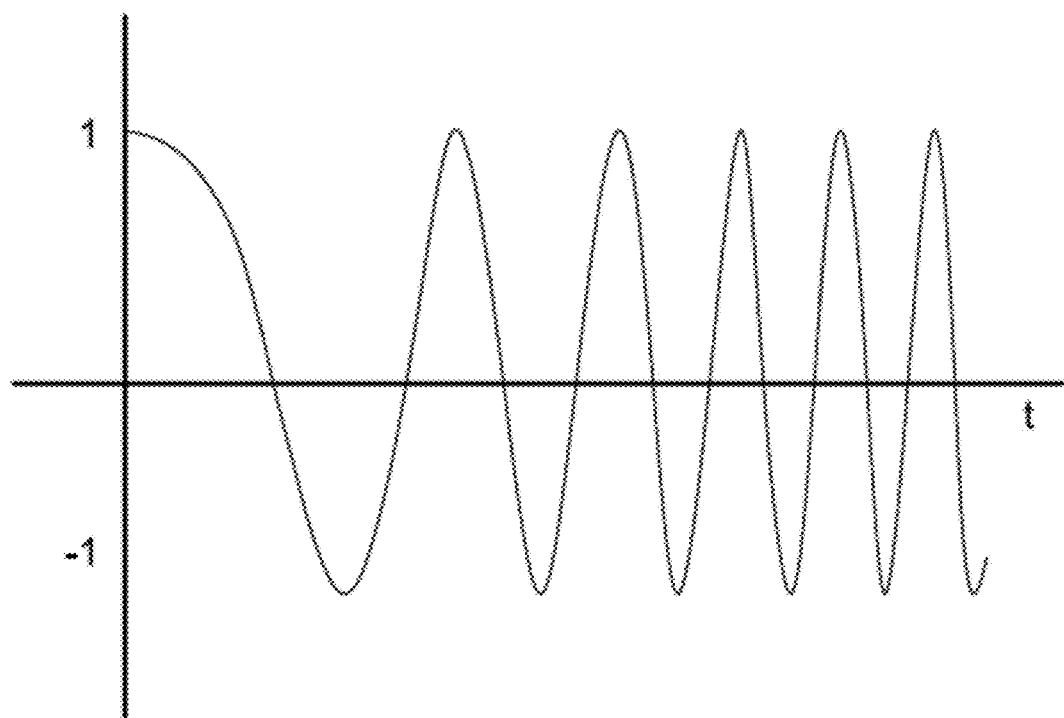
FIGS. 7A-7B illustrate A) positive chirp +s(t) representing logic 1 and B) negative chirp −s(t) representing logic 0.
Figure 7B:
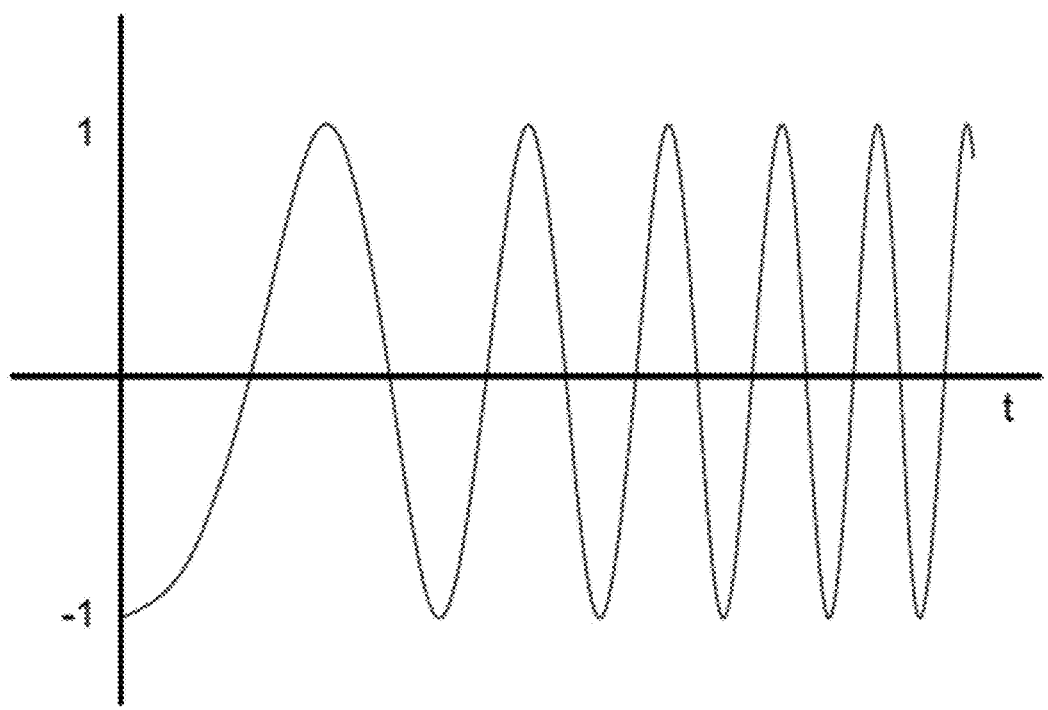
Figure 8A:
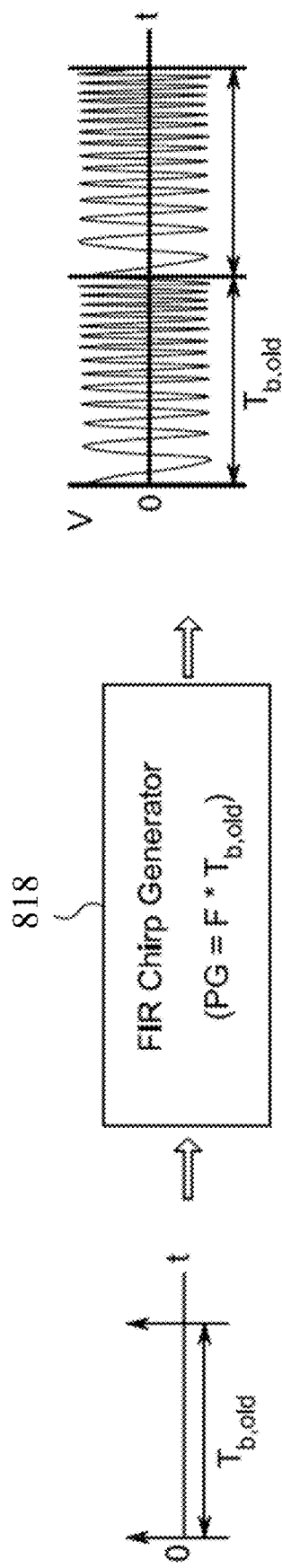
FIGS. 8A-8B show two examples of the output of the FIR Chirp generator being impulsed by antipodal pulses where in A) there is no overlapping in the consecutive bits in the CSS transmission transmitted at the rate of $R_{old}$=1/$T_{b,old}$, while in B) there is time overlapping as the pulse rate is increased to $R_{new}$=1/$T_{b,new}$ when $T_{b,new}$=$T_{b,old}$/2.
Figure 8B:
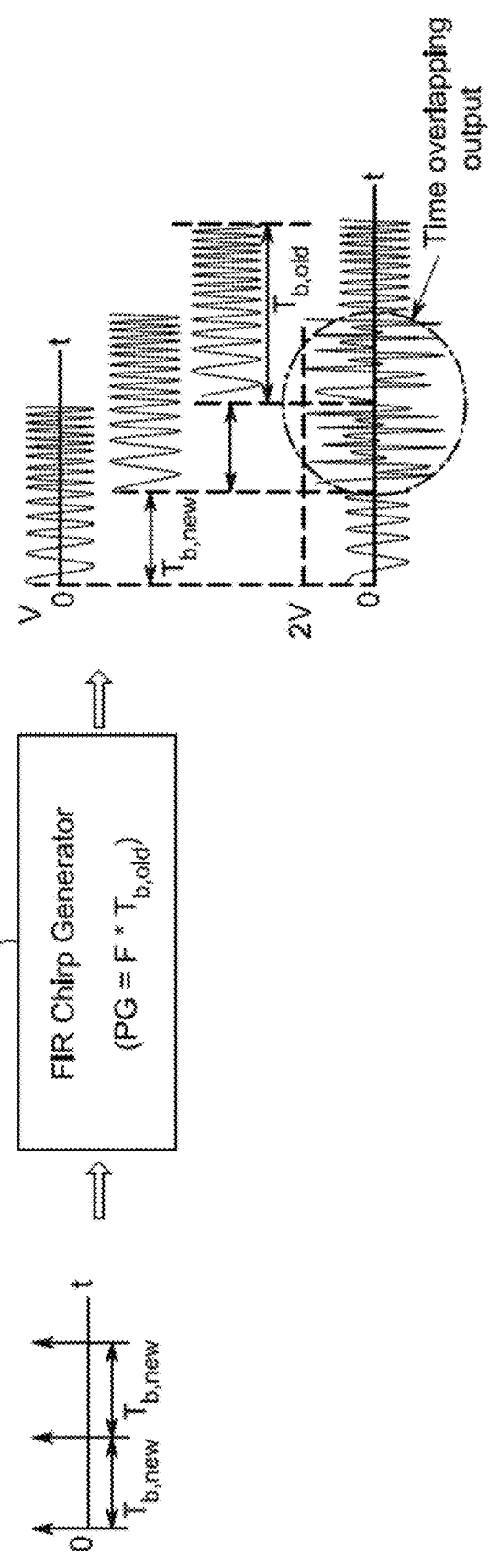

The FIR chirp filter is designed using digital signal processing (DSP), thus when a pulse is applied (a digital signal with very short duration), the output of the filter produces a chirp signal +s(t) if the pulse is positive (representing logic 1, Mark) as shown in FIG. 7A, or −s(t) if the pulse is negative (representing logic 0, Space), as shown in FIG. 7B. The output chirp signal has processing gain equal to the original sweeping frequency (F) multiplied by the original bit duration ($T_{b,old}$) to maintain the system FT product. FIG. 8A shows an example of CSS with without overlapping and FIG. 8B shows the example with overlapping generated by impulsing the FIR filter using antipodal pulses.

The final stage at the transmitter side is to apply the output of the chirp FIR filter generator 418 to an amplifier 420 with a gain equal to $R_{new}/R_{old}$. As an example of increasing the data rate by order of 4, i.e. $R_{new}=4R_{old}$, the adaptive gain of the signal must be at least 4 in order to have the same performance (in terms of bit error rate in the presence of noise) as there is with no time overlapping, as the increase in data rate scales linearly with the transmitted power.

An antenna 421 transmits the encoded signals over a wireless communication channel to the receiver 430.

A first computing device 411a is operatively connected to the adaptive overlapping transmitter, the first computing device including a first computer-readable medium comprising first program instructions, executable by first processing circuitry, to cause the first processing circuitry to modulate the bit stream of data signals by a plurality of overlapping chirps and actuate the wireless antenna to transmit the chirp modulated stream of data signals.

The first computing device 411a is configured to increase the first data rate; input clock signals to the data rate generator and the antipodal pulse filter; provide bias voltages to the AND gates and operational amplifier of the antipodal pulse converter; adjust a set of first filter coefficients of the FIR chirp generator; provide voltage to the amplifier; and provide timing signals to the amplifier.

At the non-coherent receiver 430, the received CSS signals are applied to the input of a FIR chirp matched filter 432. This matched filter is executed using digital signal processing as a finite impulse filter (FIR) by modifying the FIR filter coefficients. A FIR filter is designed by finding the coefficients and filter order that meet certain specifications, which can be in the time domain (e.g. a matched filter) and/or the frequency domain (most common). Matched filters perform a cross-correlation between the input signal and a known pulse shape. The FIR convolution is a cross-correlation between the input signal and a time-reversed copy of the impulse response. Therefore, the matched filter's impulse response is "designed" by sampling the known pulse-shape and using those samples in reverse order as the coefficients of the filter. The FIR chirp matched filter is used to match a generated chirp signal produced in the receiver having an FT product equal to the original frequency sweep (F) multiplied by the original bit duration ($T_{b,old}$). The output of the matched filter for each symbol is similar to that shown in FIG. 3B.

For non-coherent detection, it is necessary to multiply the received chirp signal by its predecessor (as a counter measurement for the differential conversion in the transmitter), which is achieved by delaying the output of the current signal from the FIR chirp matched filter in a FIR delay filter 434 and then multiplying the delayed chirp matched signal in multiplier 436 by the output of the matched filter of the next bit (see feed forward arrow 435). The delay process may be achieved by programming a FIR delay filter 434 using digital signal processing to adjust the filter coefficients. The delay is equal to the duration of one bit (i.e., $T_{b,old}$).

Figure 8C:
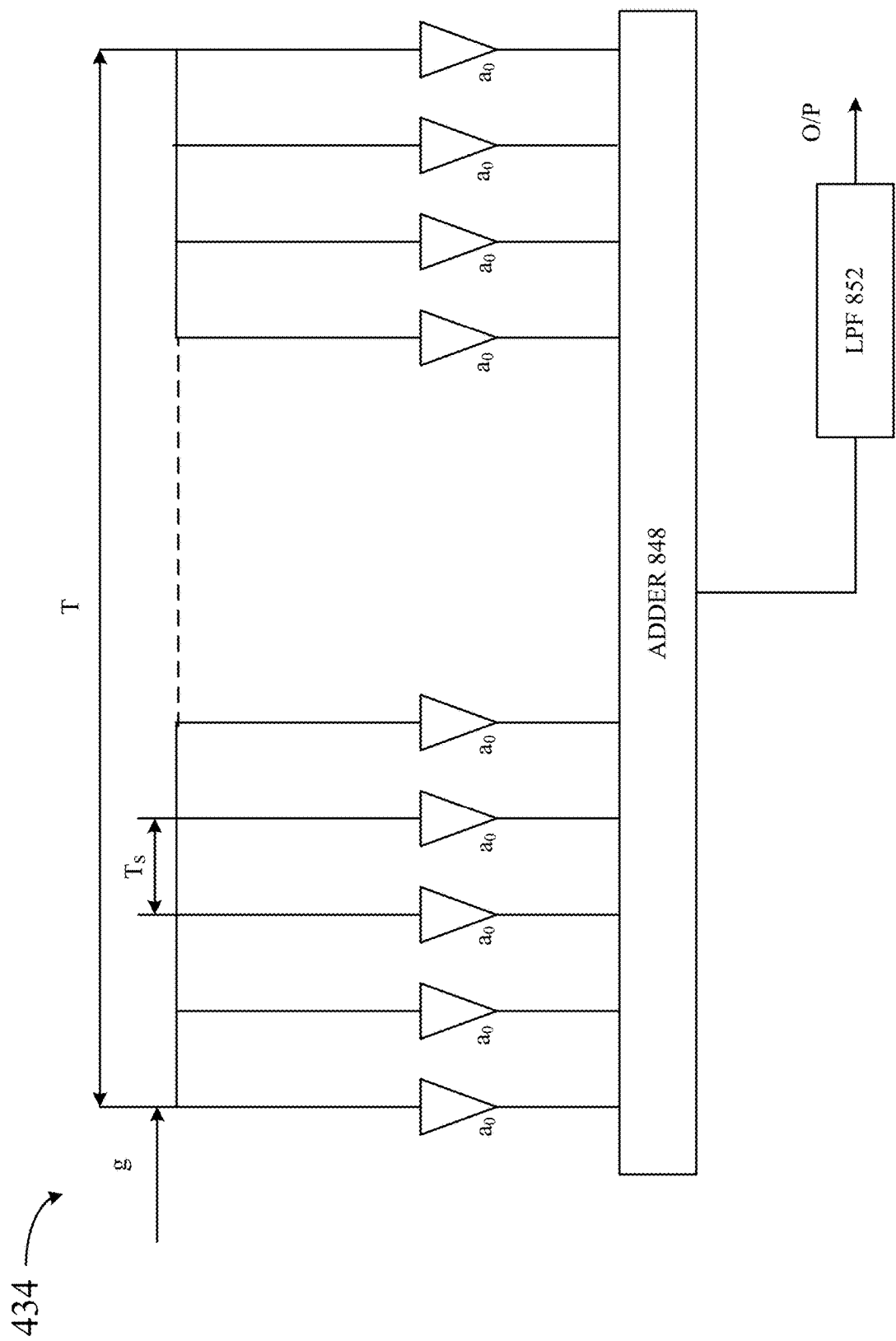
FIG. 8C illustrates a FIR delay filter.

The FIR delay filter is shown in FIG. 8C. In a non-limiting example, the FIR delay filter may be a DSP56303EVM, (DSP56303EVM Evaluation Module, Freescale Semiconductor, Technical Information Center, CH370, 1300 N. Alma School Road, Chandler, Ariz., U.S.A, www.freescale.com). The FIR coefficients $a_0, a_1, \ldots, a_n$ are the sample values of the impulse response desired. The FIR coefficients are stored on RAM memory as a TXT file in the first computing device. In this file, the sample values of the matched filter impulse response are saved, i.e, the sample values of the matching function f(−t). In the experimental implementation, f(−t) was sampled at 16 k sample per second. For the FIR delay filter, the input is the output from the FIR chirp matched filter 432. The input is sampled at intervals of $T_s$ seconds by each FIR filter in turn. These samples are added in adder 648 and passed through low pass filter 652 to remove high frequency noise components. The output O/P is then sent to the multiplier 436 along with an instance of the non-delayed signal from the output of the FIR chirp matched filter 432.

The output of the multiplier is then fed to an integrator 437, which is adjusted to integrate over the main lobes in order. An integrator is an element whose output signal is the time integral of its input signal. An integrator accumulates the input quantity over a defined time to produce a representative output. In the experiments of the present disclosure, it was found that integration of the multiplied chirp matched signal over a duration equivalent to 0.2 $T_{b,new}$ (see FIG. 9A) gave optimum performance. Therefore, the data rate of the system may be increased to up to 5-fold before the main lobes begin to overlap with one another (i.e., the problem of ISI becomes apparent).

The output of the integrator 437 is fed to decision circuit 438. Based on the sign of the signal at the output of the integrator, the decision circuit decides whether the received bit is logic zero or logic one.

The decision circuit is configured with a second computing device (411a, FIG. 4) including a second computer-readable medium comprising second program instructions, executable by second processing circuitry, to cause the second processing circuitry to determine a polarity of each bit based on the sum of the amplitudes, convert each bit to a one or a zero based on its polarity and output a decoded stream of ones and zeroes representative of the data signals.

The second computing device 411a is operatively connected to the non-coherent FIR chirp matched filter, the FIR delay filter, the multiplier and the integrator, wherein the computing device is further configured to generate the internal chirp signal, adjust the filter coefficients of the non-coherent FIR chirp matched filter and the FIR delay filter and control the time period of the integrator.

FIGS. 9A, 9B and 9C show a timing diagram of the receiver processes. FIG. 9A shows the output after multiplication for an integration window of 0.2 $T_{b,new}$. In FIG. 9B, the integration window is positioned over the main lobe and adjusted to the length of 0.2 $T_{b,new}$. FIG. 9C shows the output after integration which is applied to the decision circuit which decides the logical representation of the bit based on the polarity (i.e. a positive output represents logic 1 and a negative output represents logic 0).

The system illustrated in FIG. 4 was constructed in hardware and experiments were performed to verify the operation. The experimental results were compared by plotting energy/noise (dB) versus the log of the probability of bit error (Log ($P_e$)).

In digital transmission, the number of bit errors is the number of received bits of a data stream over a communication channel that have been altered due to noise, interference, distortion or bit synchronization errors. The bit error rate (BER) is the number of bit errors per unit time. The bit error ratio (also BER) is the number of bit errors divided by the total number of transferred bits during a studied time interval. Bit error ratio is a unitless performance measure, often expressed as a percentage. The bit error probability $P_e$ is the expectation value of the bit error ratio. The bit error ratio can be considered as an approximate estimate of the bit error probability.

Figure 10:
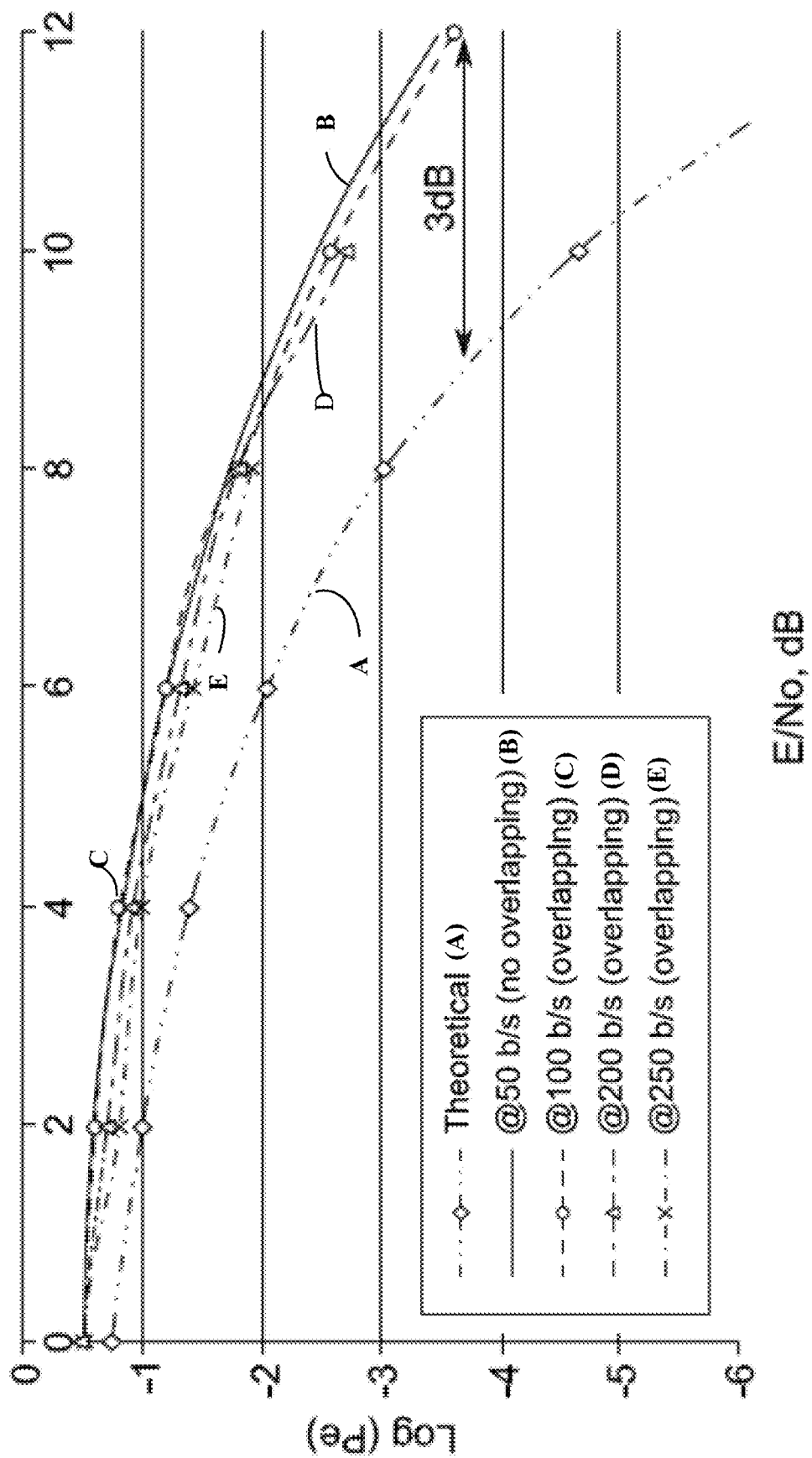
FIG. 10 is a performance evaluation based on experimental results which shows the energy to noise ratio versus the probability of bit error rate (logarithmic scale).

The experimental results show that the CSS data rate can be increased by the means of adaptive overlapping while achieving the same performance as in the case with no overlapping. FIG. 10 shows graphs of the system performance (energy/noise (dB)) in terms of the logarithm of probability of bit error rate, Log(BER), in the presence of white Gaussian noise. The performance evaluation is based on experimental results which show the energy to noise ratio versus the probability of bit error rate (logarithmic scale). The results shows several experiments with data rate increased by 2, 4, and 5 fold and the curve of each experiment is plotted against the energy to noise ratio. Line A shows the theoretical output. Line B shows the output at 50 b/s with no overlapping. Line C shows the output at 100 b/s with overlapping. Line D shows the output at 200 b/s with overlapping. Line E shows the output at 250 b/s with overlapping. Therefore, the performance after the data rate increase by means of adaptive overlapping is similar to the performance with no overlapping. It was also noticed that the performance of all experimental data rates is 3 dB less than for a theoretical evaluation of non-coherent detection (Line A), which may be expected due to imperfection of the real life experimentation.

The first embodiment is illustrated with respect to FIGS. 4-6, and FIGS. 11-13. The first embodiment describes a system 400 for transmission and non-coherent detection of data signals modulated by a plurality of overlapping chirps in a chirp spread spectrum communication system (CSS), comprising an adaptive overlapping transmitter 410 configured to receive a bit stream of data signals at a first data rate ($R_{old}$) and a sweep frequency (F), the adaptive overlapping transmitter including a data rate generator 412 configured to increase the first data rate ($R_{old}$) of the bit stream of data signals to a second data rate ($R_{new}$), wherein the second data rate is greater than the first data rate, a differential phase converter 414 configured to encode the data signals at the second data rate with a phase difference between each two consecutive bits and generate a phase encoded bit stream, an antipodal pulse converter 416 connected in series to the data rate generator and configured to convert the phase encoded bit stream to positive and negative pulses, a finite impulse response (FIR) chirp generator 418 connected in series to the antipodal pulse converter and configured to generate chirp signals from the positive and negative pulses, a gain amplifier 420 connected in series to the FIR chirp generator and configured to increase the gain of the chirp signals and output a chirp modulated stream of data signals, a wireless antenna 421 connected in series with the gain amplifier and configured to transmit the chirp modulated stream of data signals, a first computing device 411a operatively connected to the adaptive overlapping transmitter 410, the first computing device including a first computer-readable medium comprising first program instructions, executable by first processing circuitry (as shown generally as CPU 1101 and/or CPU 1103, FIG. 11), to cause the first processing circuitry to modulate the bit stream of data signals by a plurality of overlapping chirps and actuate the wireless antenna to transmit the chirp modulated stream of data signals, a non-coherent receiver 430 configured to receive the chirp modulated stream of data signals, the non-coherent receiver comprising a non-coherent finite impulse response (FIR) chirp matched filter 432 configured to match the chirp modulated stream of data signals and generate a first chirp matched signal, a FIR delay filter 434 operatively connected to the non-coherent finite impulse response (FIR) chirp matched filter and configured to generate a second chirp matched signal which is phase shifted from the first chirp matched signal, a multiplier 436 operatively connected to the FIR delay filter and configured to multiply the second chirp matched signal by the first chirp matched signal to generate a multiplied chirp matched signal, an integrator 437 operatively connected to the multiplier and configured to sum the amplitudes of multiplied chirp matched signal over a time period, a decision circuit 438 operatively connected to the integrator and connected to a second computing device 411b including a second computer-readable medium (as shown generally as CPU 1101 and/or CPU 1103, FIG. 11) comprising second program instructions, executable by second processing circuitry, to cause the second processing circuitry to determine a polarity of each bit based on the sum of the amplitudes, convert each bit to a one or a zero based on its polarity and output a decoded stream of ones and zeroes representative of the data signals.

The DPSK converter 414 includes a flip-flop 544 including a clock input (3), a feedback input (2) and an output terminal (5), a NOR gate 546 including a first input port (6) connected to the data signals, a second input port (7) connected to the output terminal, and a DPSK output (8), wherein the DPSK output (8) is connected to the feedback input (2) and provides the phase encoded bit stream (9).

The antipodal pulse generator comprises a first AND gate 605 having a first (1) and second (2) input and a first AND output (f), wherein the first input is configured to receive an inverted phase encoded bit stream ((9) from FIG. 5, passed through inverter 604) and the second input is configured to receive the stream of data signals (at a second data rate ($R_{new}$), a second AND gate 606 in parallel with the first AND gate 605 and having a third input (3) and fourth input (4) and a second AND output (e), wherein the third input is configured to receive the stream of data signals at the second data rate ($R_{new}$) and the fourth input is configured to receive a non-inverted clock signal ((9) from FIG. 5), a first resistor $R_1$ connected in series with the first AND output, a second resistor $R_2$ connected in series with the second AND output, a first operational amplifier 608 having an inverting (−) and a non-inverting input (+) and a gain output (g), wherein the inverting input is connected in series with the first resistor and the non-inverting input is connected to the second resistor, a third resistor $R_3$ connected in series with the gain output and the inverting input, and a fourth resistor $R_4$ connected to the second resistor and the non-inverting input.

The FIR chirp generator is further operatively configured to modulate the positive and negative pulses by increasing a modulation frequency over a duration of each pulse so that the product of the frequency and the duration equals a processing gain of 54.

The gain amplifier 420 is operatively configured to increase the gain of the chirp signals by a factor equal to the second data rate divided by the first data rate ($R_{new}/R_{old}$).

The non-coherent FIR chirp matched filter 432 is configured to generate an internal chirp signal having an FT product equal to the sweep frequency (F) multiplied by the inverse of the first data rate and match the internal chirp signal to the chirp modulated stream of data signals.

The FIR delay filter 434 includes filter coefficients which are adjustable to generate a selected delay.

The integrator 437 is configured to sum the amplitudes of the multiplied chirp matched signals over a time period equal to 0.2 times $T_{b,new}$.

The first computing device 411a is operatively connected to the data generator 412, the differential phase converter 414, the antipodal pulse converter 416, the FIR chirp generator 418 the amplifier 420, and the antenna 421, wherein the first computing device is further configured to increase the first data rate, input a clock signal to the differential phase converter 414, provide bias voltages to the AND gates (605, 606) and operational amplifier (608) of the antipodal pulse converter 416, adjust a set of first filter coefficients of the FIR chirp generator 418, provide voltage to the amplifier 420, and provide timing signals to the antenna 421.

The second computing device 411b is further operatively connected to the non-coherent FIR chirp matched filter 432, the FIR delay filter 434, the multiplier 436 and the integrator 438, wherein the computing device is further configured to generate the internal chirp signal, adjust the filter coefficients of the non-coherent FIR chirp matched filter and the FIR delay filter and control the time period of the integrator.

The second embodiment is illustrated with respect to FIGS. 4-6, and FIGS. 11-13. The second embodiment describes a method for modulating data signals with a plurality of overlapping chirps by an adaptive overlapping transmitter 430 in a chirp spread spectrum communication system (CSS), comprising receiving a stream of data signals at a first data rate ($R_{old}$), increasing the first data rate of the data signals to a second data rate ($R_{new}$) (at data generator 412), encoding the data signals at the second data rate with a phase difference between each two consecutive bits (at differential phase converter 414) and generating a phase encoded bit stream, converting the data signals to positive and negative pulses (by antipodal pulse converter 416), generating a plurality of overlapping chirp signals from the positive and negative pulses (by FIR chirp generator 418), increasing the gain of the chirp signals by a factor equal to the ratio of the second data rate divided by the first data rate (by amplifier 420) and outputting an encoded stream of data signals modulated by a plurality of overlapping chirps, transmitting (by antenna 421) the encoded stream in the chirp spread spectrum communications system.

The method includes modulating the positive and negative pulses with a FIR chirp generator 418 which is operatively configured to increase a frequency over a duration of each pulse so that the product of the frequency and the duration equals a processing gain of 54.

The method further comprises generating the plurality of overlapping chirp signals by modulating the positive and negative pulses with a first positive chirp signal at a first data rate, $R_1$, during a first time period, $T_1$, modulating the data with a second positive chirp signal at a second data rate, $R_2$, during a second time period, $T_2$, where $R_2=1/T_1$ when $T_2=T_1/2$.

The method includes increasing the gain of the plurality of overlapped chirp signals by a factor equal to the second data rate divided by the first data rate ($R_{new}/R_{old}$).

The method includes performing, by a computing system 411a operatively connected to the adaptive overlapping transmitter 410, the functions of inputting a clock signal to a differential phase converter 414, providing bias voltages to first (605) and second (306) AND gates and an operational amplifier (608) of an antipodal pulse converter 416, adjusting a set of first filter coefficients of a FIR chirp generator 418; providing voltage to an amplifier 420, and providing timing signals to an antenna 421.

The third embodiment is illustrated with respect to FIGS. 4-6, and FIGS. 11-13. The third embodiment describes a method for non-coherent detection of data signals modulated by a plurality of overlapping chirps in a chirp spread spectrum communication system (CSS), comprising receiving an encoded stream of data signals modulated by a plurality of overlapping chirps by a non-coherent receiver at non-coherent FIR chirp matched filter, the encoded stream having a data rate, $T_{b,new}$, generating an internal chirp signal by a non-coherent finite impulse response (FIR) chirp matched filter, the internal chirp signal having an FT product equal to a sweep frequency (F) multiplied by the inverse of the data rate of the chirp spread spectrum communication system, $T_{b,old}$, matching the encoded stream to the internal chirp signal and generating a stream of first chirp matched signals, delaying each first chirp matched signal by a FIR delay filter and generating a second chirp matched signal which is phase shifted from the first chirp matched signal, multiplying the second chirp matched signal by the first chirp matched signal and generating a stream of multiplied chirp matched signals each having a main lobe, integrating a plurality of amplitudes of the stream of multiplied chirp matched signals over each main lobe for a time period less than the inverse of the first data rate and generating a sum of the amplitudes for each of the multiplied chirp matched signals, determining a polarity of the sum of the amplitudes for each of the multiplied chirp matched signals, converting each sum to a one or a zero based on the polarity, and outputting a decoded stream of ones and zeroes representative of a plurality of data signals.

The method further comprises adjusting filter coefficients of the FIR delay filter to generate a selected delay value, wherein the selected delay value is less than $T_{b,new}$.

The method further comprises summing the amplitudes of each of the multiplied chirp matched signals over a time period equal to 0.2 times $T_{b,new}$.

The method further comprises adjusting, by a computing system operatively connected to the non-coherent receiver, the filter coefficients of the non-coherent FIR chirp matched filter, adjusting the filter coefficients of the FIR delay filter, and controlling the time period of the integrating.

Figure 11:
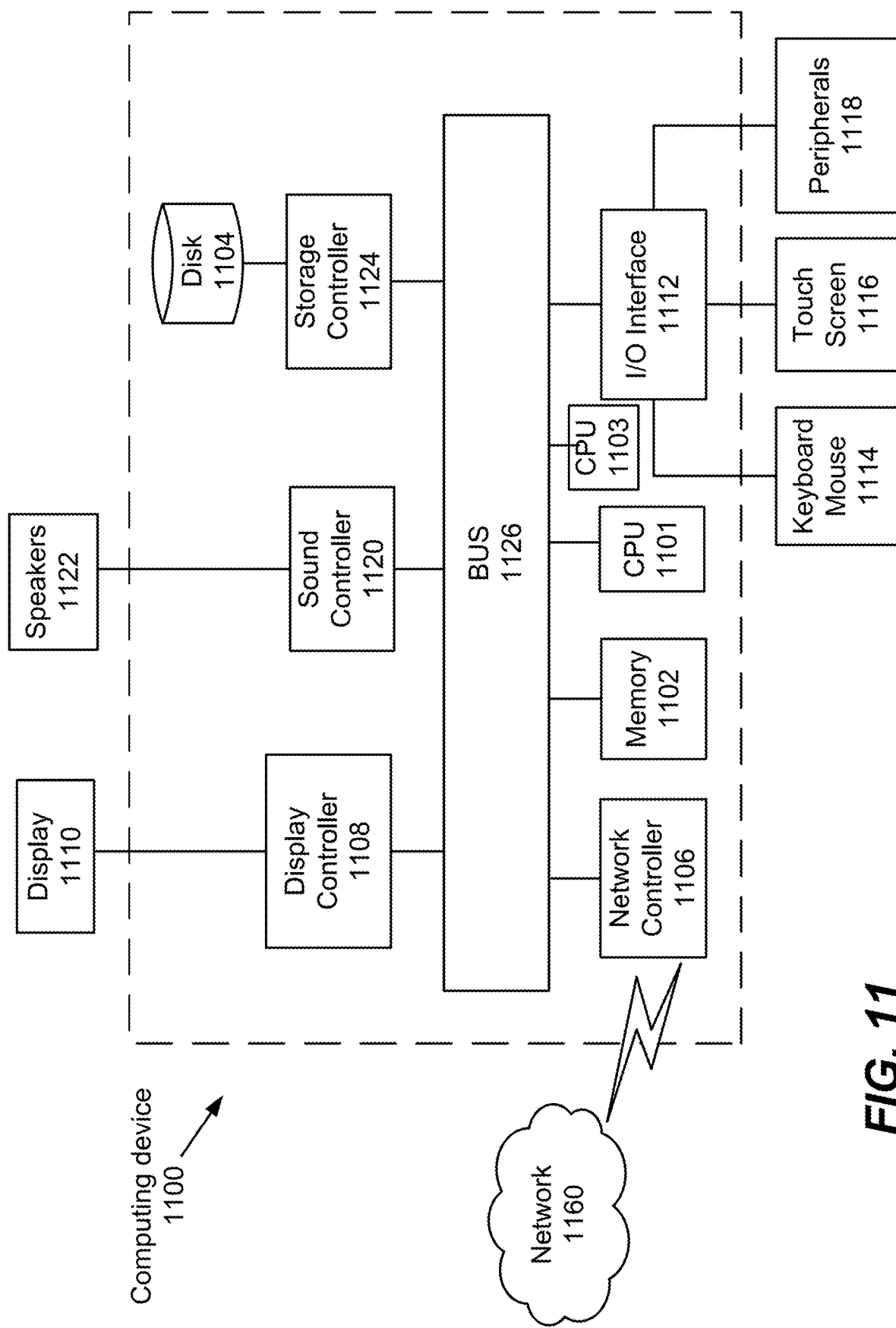
FIG. 11 is an illustration of a non-limiting example of details of computing hardware used in the computing system, according to certain embodiments.

Next, further details of the hardware description of the computing environment of FIG. 4 according to exemplary embodiments is described with reference to FIG. 11. In FIG. 11, a controller 1100 is described is representative of the architecture of first computing device 411a or of the second computing device 411b of FIG. 4 in which the controller is a computing device which includes a CPU 1101 which performs the processes described above/below. The process data and instructions may be stored in memory 1102. These processes and instructions may also be stored on a storage medium disk 1104 such as a hard drive (HDD) or portable storage medium or may be stored remotely.

Further, the claims are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the computing device communicates, such as a server or computer.

Further, the claims may be provided as a utility application, background daemon, or component of an operating system, or combination thereof, executing in conjunction with CPU 1101, 1103 and an operating system such as Microsoft Windows 7, UNIX, Solaris, LINUX, Apple MAC-OS and other systems known to those skilled in the art.

The hardware elements in order to achieve the computing device may be realized by various circuitry elements, known to those skilled in the art. For example, CPU 1101 or CPU 1103 may be a Xenon or Core processor from Intel of America or an Opteron processor from AMD of America, or may be other processor types that would be recognized by one of ordinary skill in the art. Alternatively, the CPU 1101, 1103 may be implemented on an FPGA, ASIC, PLD or using discrete logic circuits, as one of ordinary skill in the art would recognize. Further, CPU 1101, 1103 may be implemented as multiple processors cooperatively working in parallel to perform the instructions of the inventive processes described above.

The computing device in FIG. 11 also includes a network controller 1106, such as an Intel Ethernet PRO network interface card from Intel Corporation of America, for interfacing with network 1160. As can be appreciated, the network 1160 can be a public network, such as the Internet, or a private network such as an LAN or WAN network, or any combination thereof and can also include PSTN or ISDN sub-networks. The network 1160 can also be wired, such as an Ethernet network, or can be wireless such as a cellular network including EDGE, 3G and 4G wireless cellular systems. The wireless network can also be WiFi, Bluetooth, or any other wireless form of communication that is known.

The computing device further includes a display controller 1108, such as a NVIDIA GeForce GTX or Quadro graphics adaptor from NVIDIA Corporation of America for interfacing with display 1110, such as a Hewlett Packard HPL2445w LCD monitor. A general purpose I/O interface 1112 interfaces with a keyboard and/or mouse 1114 as well as a touch screen panel 1116 on or separate from display 1110. General purpose I/O interface also connects to a variety of peripherals 1118 including printers and scanners, such as an OfficeJet or DeskJet from Hewlett Packard.

A sound controller 1120 is also provided in the computing device such as Sound Blaster X-Fi Titanium from Creative, to interface with speakers/microphone 1122 thereby providing sounds and/or music.

The general purpose storage controller 1124 connects the storage medium disk 1104 with communication bus 1126, which may be an ISA, EISA, VESA, PCI, or similar, for interconnecting all of the components of the computing device. A description of the general features and functionality of the display 1110, keyboard and/or mouse 1114, as well as the display controller 1108, storage controller 1124, network controller 1106, sound controller 1120, and general purpose I/O interface 1112 is omitted herein for brevity as these features are known.

The exemplary circuit elements described in the context of the present disclosure may be replaced with other elements and structured differently than the examples provided herein. Moreover, circuitry configured to perform features described herein may be implemented in multiple circuit units (e.g., chips), or the features may be combined in circuitry on a single chipset, as shown on FIG. 12.

Figure 12:
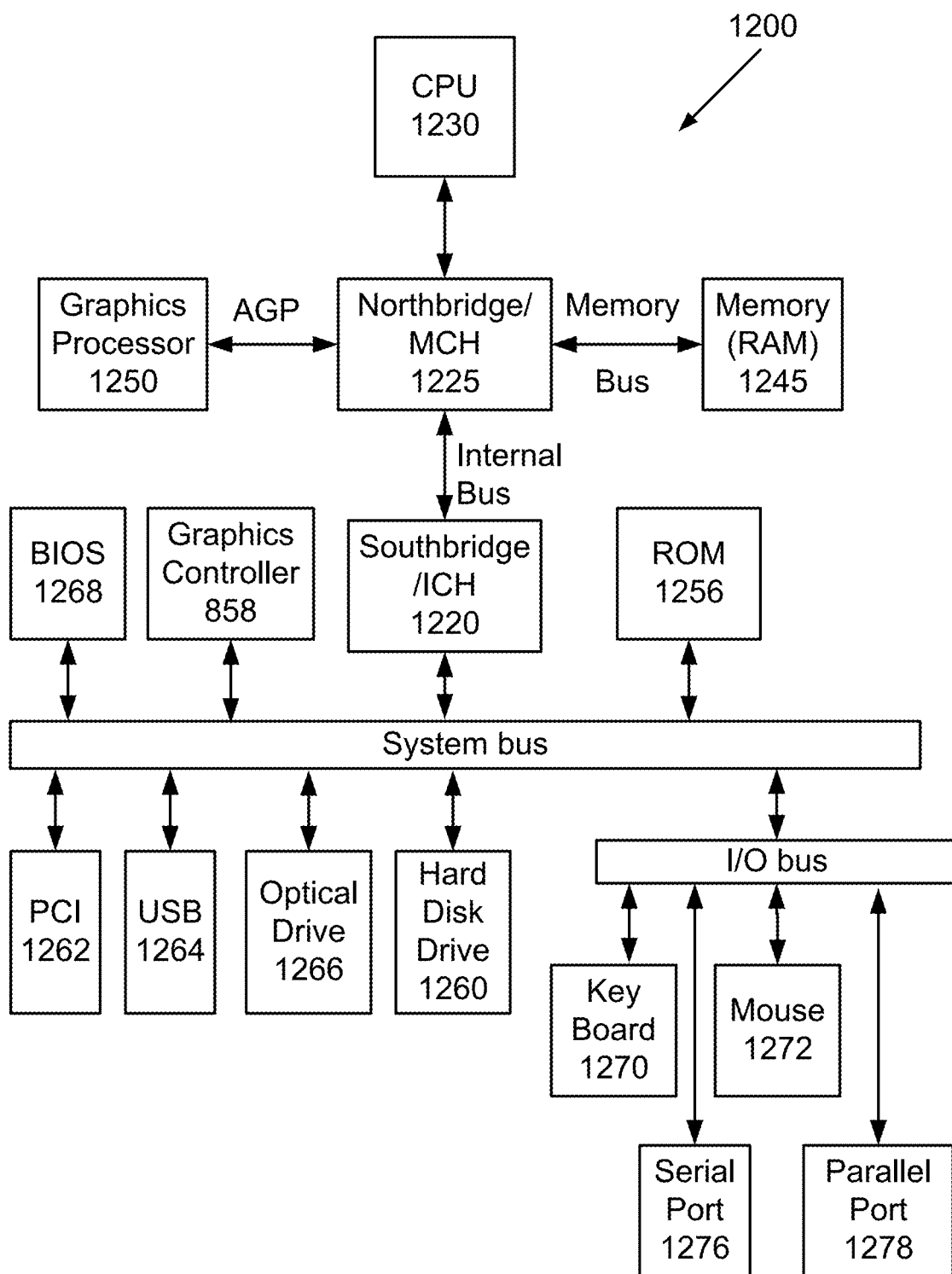
FIG. 12 is an exemplary schematic diagram of a data processing system used within the computing system, according to certain embodiments.
Figure 13:
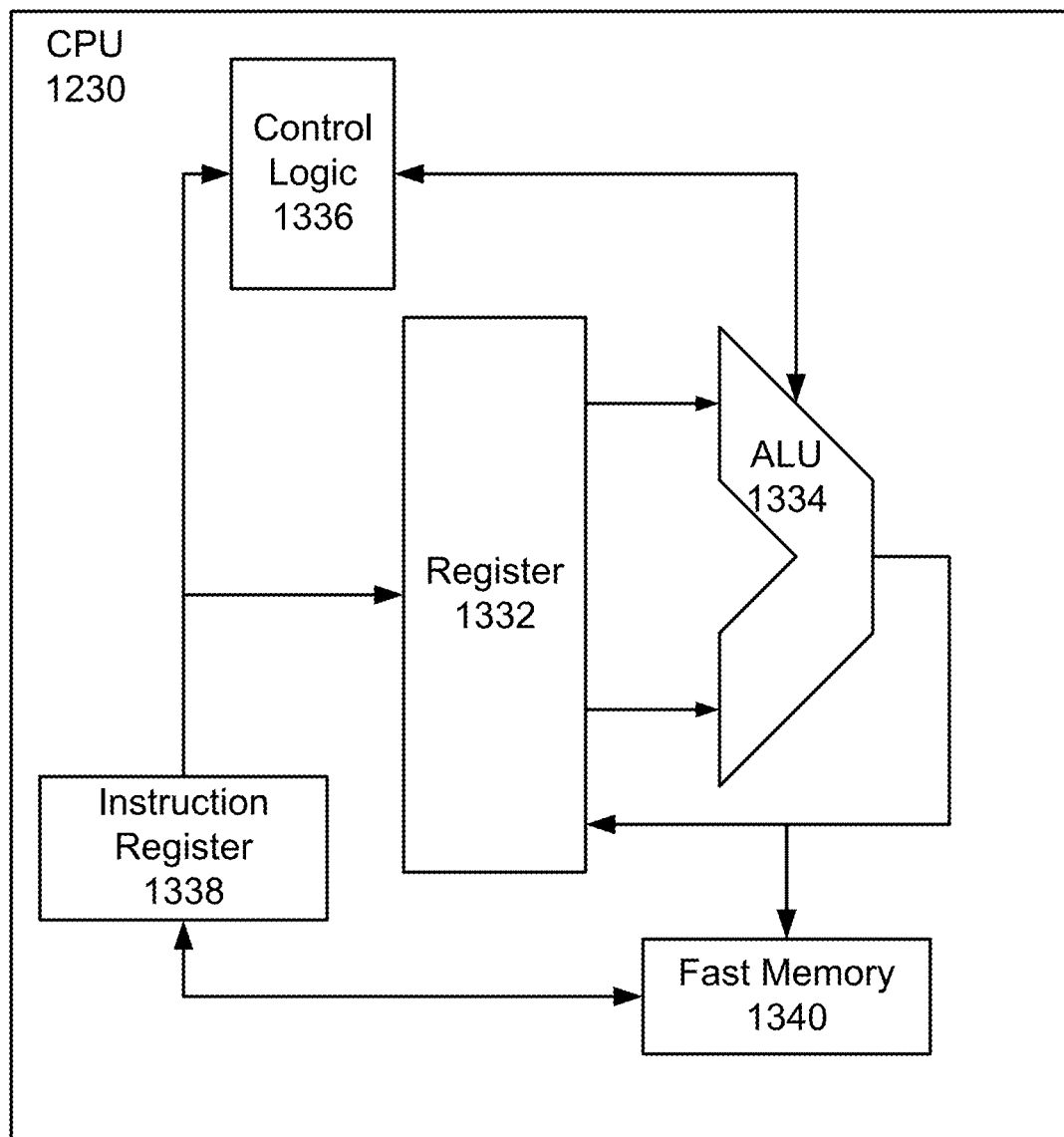
FIG. 13 is an exemplary schematic diagram of a processor used with the computing system, according to certain embodiments.
Figure 14:
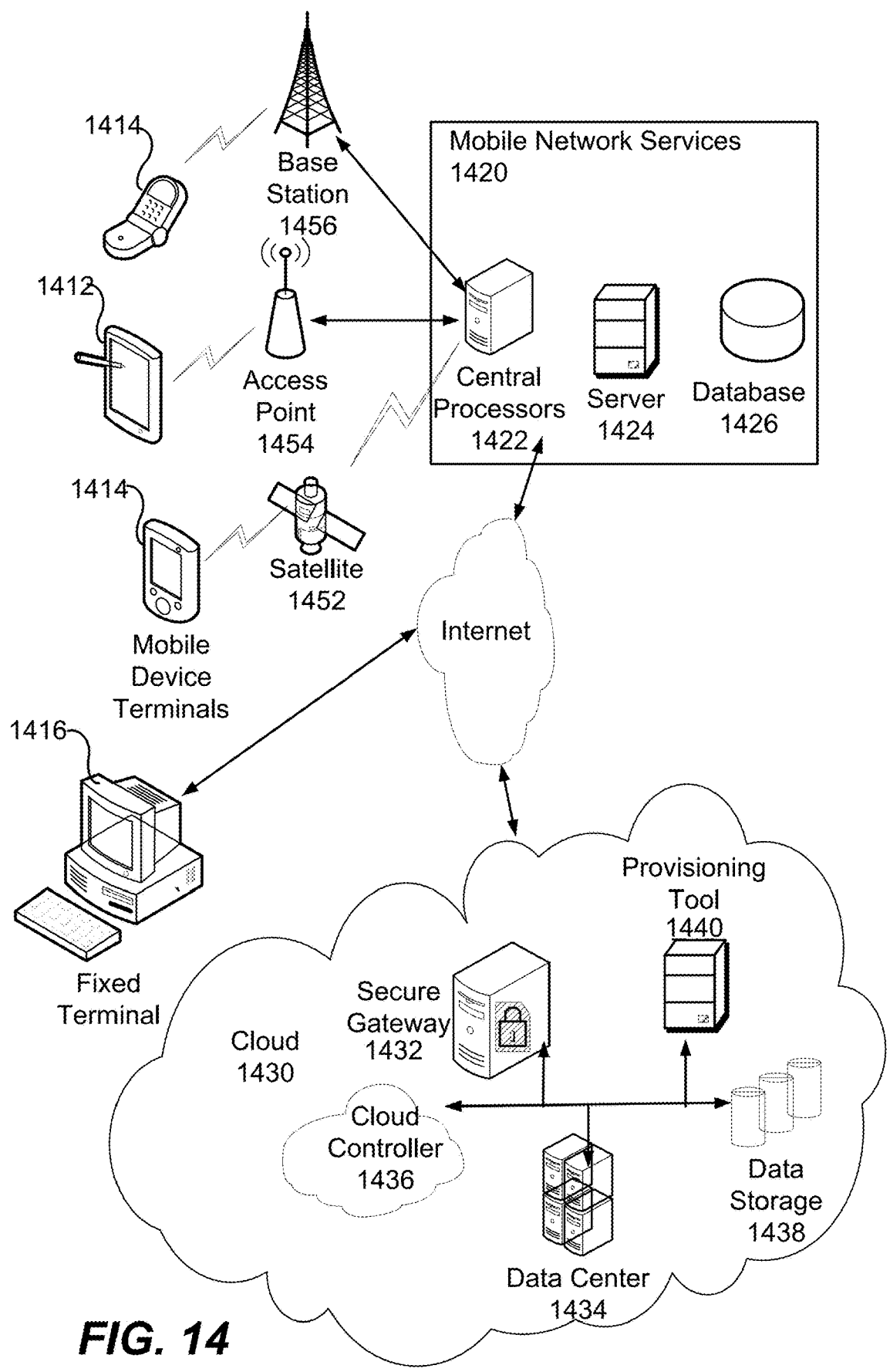
FIG. 14 is an illustration of a non-limiting example of distributed components which may share processing with the controller, according to certain embodiments.

FIG. 12 shows a schematic diagram of a data processing system, according to certain embodiments, for performing the functions of the exemplary embodiments. The data processing system is an example of a computer in which code or instructions implementing the processes of the illustrative embodiments may be located.

In FIG. 12, data processing system 1200 employs a hub architecture including a north bridge and memory controller hub (NB/MCH) 1225 and a south bridge and input/output (I/O) controller hub (SB/ICH) 1220. The central processing unit (CPU) 1230 is connected to NB/MCH 1225. The NB/MCH 1225 also connects to the memory 1245 via a memory bus, and connects to the graphics processor 1250 via an accelerated graphics port (AGP). The NB/MCH 1225 also connects to the SB/ICH 1220 via an internal bus (e.g., a unified media interface or a direct media interface). The CPU Processing unit 1230 may contain one or more processors and even may be implemented using one or more heterogeneous processor systems.

For example, FIG. 9 shows one implementation of CPU 1230. In one implementation, the instruction register 938 retrieves instructions from the fast memory 940. At least part of these instructions are fetched from the instruction register 938 by the control logic 936 and interpreted according to the instruction set architecture of the CPU 1230. Part of the instructions can also be directed to the register 932. In one implementation the instructions are decoded according to a hardwired method, and in another implementation the instructions are decoded according a microprogram that translates instructions into sets of CPU configuration signals that are applied sequentially over multiple clock pulses. After fetching and decoding the instructions, the instructions are executed using the arithmetic logic unit (ALU) 934 that loads values from the register 932 and performs logical and mathematical operations on the loaded values according to the instructions. The results from these operations can be feedback into the register and/or stored in the fast memory 940. According to certain implementations, the instruction set architecture of the CPU 1230 can use a reduced instruction set architecture, a complex instruction set architecture, a vector processor architecture, a very large instruction word architecture. Furthermore, the CPU 1230 can be based on the Von Neuman model or the Harvard model. The CPU 1230 can be a digital signal processor, an FPGA, an ASIC, a PLA, a PLD, or a CPLD. Further, the CPU 1230 can be an x86 processor by Intel or by AMD; an ARM processor, a Power architecture processor by, e.g., IBM; a SPARC architecture processor by Sun Microsystems or by Oracle; or other known CPU architecture.

Referring again to FIG. 12, the data processing system 1200 can include that the SB/ICH 1220 is coupled through a system bus to an I/O Bus, a read only memory (ROM) 1256, universal serial bus (USB) port 1264, a flash binary input/output system (BIOS) 1268, and a graphics controller 1258. PCI/PCIe devices can also be coupled to SB/ICH 1288 through a PCI bus 1262.

The PCI devices may include, for example, Ethernet adapters, add-in cards, and PC cards for notebook computers. The Hard disk drive 1260 and CD-ROM 1266 can use, for example, an integrated drive electronics (IDE) or serial advanced technology attachment (SATA) interface. In one implementation the I/O bus can include a super I/O (SIO) device.

Further, the hard disk drive (HDD) 1260 and optical drive 1266 can also be coupled to the SB/ICH 1220 through a system bus. In one implementation, a keyboard 1270, a mouse 1272, a parallel port 1278, and a serial port 1276 can be connected to the system bus through the I/O bus. Other peripherals and devices that can be connected to the SB/ICH 1220 using a mass storage controller such as SATA or PATA, an Ethernet port, an ISA bus, a LPC bridge, SMBus, a DMA controller, and an Audio Codec.

Moreover, the present disclosure is not limited to the specific circuit elements described herein, nor is the present disclosure limited to the specific sizing and classification of these elements. For example, the skilled artisan will appreciate that the circuitry described herein may be adapted based on changes on battery sizing and chemistry, or based on the requirements of the intended back-up load to be powered.

The functions and features described herein may also be executed by various distributed components of a system. For example, one or more processors may execute these system functions, wherein the processors are distributed across multiple components communicating in a network. The distributed components may include one or more client and server machines, which may share processing, as shown by FIG. 10, in addition to various human interface and communication devices (e.g., display monitors, smart phones, tablets, personal digital assistants (PDAs)). The network may be a private network, such as a LAN or WAN, or may be a public network, such as the Internet. Input to the system may be received via direct user input and received remotely either in real-time or as a batch process. Additionally, some implementations may be performed on modules or hardware not identical to those described. Accordingly, other implementations are within the scope that may be claimed.

The above-described hardware description is a non-limiting example of corresponding structure for performing the functionality described herein.

Obviously, numerous modifications and variations of the present disclosure are possible in light of the above teachings. It is therefore to be understood that within the scope of the appended claims, the invention may be practiced otherwise than as specifically described herein.

The invention claimed is:

1. A wireless communication method for modulating data signals with a plurality of overlapping chirps by an adaptive overlapping transmitter in a chirp spread spectrum communication system (CSS), comprising:
   receiving a stream of data signals at a first data rate ($R_{old}$);
   increasing the first data rate of the data signals to a second data rate ($R_{new}$);
   encoding the data signals at the second data rate with a phase difference between each two consecutive bits and generating a phase encoded bit stream;
   converting the data signals to positive and negative pulses;
   generating a plurality of overlapping chirp signals from the positive and negative pulses;
   increasing the gain of the chirp signals by a factor equal to the ratio of the second data rate divided by the first data rate and outputting an encoded stream of data signals modulated by a plurality of overlapping chirps;
   transmitting the encoded stream in the chirp spread spectrum communications system over a wireless communication channel to a non-coherent receiver.

2. The wireless communication method of claim 1, comprising:
modulating the positive and negative pulses with a FIR chirp generator which is operatively configured to increase a frequency over a duration of each pulse so that the product of the frequency and the duration equals a processing gain of 54.

3. The wireless communication method of claim 1, further comprising:
generating the plurality of overlapping chirp signals by modulating the positive and negative pulses with a first positive chirp signal at a first data rate, $R_1$, during a first time period, $T_1$;
modulating the data with a second positive chirp signal at a second data rate, $R_2$, during a second time period, $T_2$; where $R_2=1/T_1$ when $T_2=T_1/2$.

4. The wireless communication method of claim 1, further comprising:
increasing the gain of the plurality of overlapped chirp signals by a factor equal to the second data rate divided by the first data rate ($R_{new}/R_{old}$).

5. The wireless communication method of claim 1, further comprising:
performing, by a computing system operatively connected to the adaptive overlapping transmitter, the functions of:
inputting a clock signal to a differential phase converter;
providing bias voltages to a first and second AND gate and an operational amplifier of an antipodal pulse converter;
adjusting a set of first filter coefficients of a FIR chirp generator;
providing voltage to an amplifier; and
providing timing signals to an antenna.

* * * * *